United States Patent
Maeda et al.

(10) Patent No.: US 9,842,909 B2
(45) Date of Patent: Dec. 12, 2017

(54) SEMICONDUCTOR DEVICE AND FABRICATING METHOD THEREOF

(71) Applicants: Shigenobu Maeda, Seongnam-si (KR); Tsukasa Matsuda, Seongnam-si (KR); Hidenobu Fukutome, Seongnam-si (KR)

(72) Inventors: Shigenobu Maeda, Seongnam-si (KR); Tsukasa Matsuda, Seongnam-si (KR); Hidenobu Fukutome, Seongnam-si (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 15/001,499

(22) Filed: Jan. 20, 2016

(65) Prior Publication Data

US 2016/0155816 A1    Jun. 2, 2016

Related U.S. Application Data

(62) Division of application No. 14/161,744, filed on Jan. 23, 2014, now Pat. No. 9,276,116.

(30) Foreign Application Priority Data

Jan. 24, 2013  (KR) .................. 10-2013-0008118

(51) Int. Cl.
H01L 21/8234 (2006.01)
H01L 29/49 (2006.01)
(Continued)

(52) U.S. Cl.
CPC ........ H01L 29/665 (2013.01); H01L 29/0847 (2013.01); H01L 29/161 (2013.01);
(Continued)

(58) Field of Classification Search
CPC . H01L 29/665; H01L 29/165; H01L 29/1608; H01L 29/7848; H01L 29/0847;
(Continued)

(56) References Cited

U.S. PATENT DOCUMENTS 5,275,715 A * 1/1994 Tuttle ................... H01L 21/2885
                                                        205/123
8,994,116 B2  3/2015 Gan et al.
(Continued)

FOREIGN PATENT DOCUMENTS

CN   102088036 A   6/2011
CN   102214579 A   10/2011
(Continued)

OTHER PUBLICATIONS

Chinese Office Action, for corresponding CN Application 20410035614.3; dated Oct. 11, 2017, 8 pages.

*Primary Examiner* — Bitew Dinke
(74) *Attorney, Agent, or Firm* — Myers Bigel, P.A.

(57) ABSTRACT

A semiconductor device is provided. The semiconductor device includes a first fin on a substrate, a first gate electrode formed on the substrate to intersect the first fin, a first elevated source/drain on the first fin on both sides of the first gate electrode, and a first metal alloy layer on an upper surface and sidewall of the first elevated source/drain.

7 Claims, 24 Drawing Sheets

(51) Int. Cl.
  *H01L 29/66* (2006.01)
  *H01L 29/78* (2006.01)
  *H01L 29/417* (2006.01)
  *H01L 29/08* (2006.01)
  *H01L 29/16* (2006.01)
  *H01L 29/161* (2006.01)
  *H01L 29/165* (2006.01)

(52) U.S. Cl.
  CPC ........ *H01L 29/165* (2013.01); *H01L 29/1608* (2013.01); *H01L 29/41791* (2013.01); *H01L 29/66545* (2013.01); *H01L 29/66795* (2013.01); *H01L 29/785* (2013.01); *H01L 29/7848* (2013.01)

(58) Field of Classification Search
  CPC ............. H01L 29/161; H01L 29/41791; H01L 29/66795; H01L 29/66545; H01L 29/785; H01L 21/823431; H01L 21/823821; H01L 21/845; H01L 27/0924; H01L 21/764; H01L 21/7682; H01L 29/0649; H01L 29/4991; H01L 27/0886; H01L 27/10826; H01L 27/10879; H01L 27/1211
  See application file for complete search history.

(56) References Cited

U.S. PATENT DOCUMENTS

| | | | |
|---|---|---|---|
| 9,324,623 B1 * | 4/2016 | Kim | H01L 21/823814 |
| 2005/0001273 A1 | 1/2005 | Bryant et al. | |
| 2005/0045965 A1 | 3/2005 | Lin et al. | |
| 2007/0075372 A1 * | 4/2007 | Terashima | H01L 29/42392 257/360 |
| 2007/0164344 A1 | 7/2007 | Park et al. | |
| 2007/0231984 A1 * | 10/2007 | Metz | H01L 21/28518 438/197 |
| 2007/0254412 A1 | 11/2007 | Dyer et al. | |
| 2008/0087967 A1 * | 4/2008 | Kim | H01L 21/823807 257/369 |
| 2008/0171408 A1 | 7/2008 | Zhu et al. | |
| 2008/0258207 A1 | 10/2008 | Radosavljevic et al. | |
| 2009/0026505 A1 | 1/2009 | Okano | |
| 2009/0085062 A1 * | 4/2009 | Jin | H01L 29/66795 257/190 |
| 2009/0170251 A1 * | 7/2009 | Jin | B82Y 10/00 438/197 |
| 2010/0276761 A1 * | 11/2010 | Tung | H01L 29/41791 257/384 |
| 2011/0079829 A1 | 4/2011 | Lai et al. | |
| 2011/0127611 A1 | 6/2011 | Lee | |
| 2011/0133285 A1 | 6/2011 | Liaw | |
| 2011/0210393 A1 | 9/2011 | Chen et al. | |
| 2011/0298058 A1 | 12/2011 | Kawasaki et al. | |
| 2012/0256238 A1 | 10/2012 | Ning et al. | |
| 2012/0280250 A1 | 11/2012 | Basker et al. | |
| 2012/0282743 A1 * | 11/2012 | Saitoh | H01L 21/845 438/152 |
| 2013/0001705 A1 | 1/2013 | Su et al. | |
| 2013/0134506 A1 | 5/2013 | Yagishita | |
| 2013/0153960 A1 | 6/2013 | Yang | |
| 2013/0187228 A1 * | 7/2013 | Xie | H01L 29/785 257/347 |
| 2013/0193446 A1 * | 8/2013 | Chao | H01L 29/66795 257/77 |
| 2013/0221414 A1 | 8/2013 | Zhao et al. | |
| 2013/0234250 A1 | 9/2013 | Lin et al. | |
| 2013/0288456 A1 * | 10/2013 | Lai | H01L 29/41791 438/478 |
| 2013/0295738 A1 | 11/2013 | Kuo et al. | |
| 2013/0320399 A1 * | 12/2013 | Chang | H01L 29/7848 257/190 |
| 2014/0001520 A1 * | 1/2014 | Glass | H01L 29/66439 257/288 |
| 2014/0134814 A1 | 5/2014 | Wong et al. | |
| 2014/0134831 A1 | 5/2014 | Chao et al. | |
| 2014/0167264 A1 | 6/2014 | Besser et al. | |
| 2014/0179070 A1 | 6/2014 | Yang | |
| 2014/0299934 A1 | 10/2014 | Kim et al. | |
| 2014/0306297 A1 | 10/2014 | Ching et al. | |
| 2014/0312427 A1 | 10/2014 | Maeda et al. | |
| 2014/0326952 A1 | 11/2014 | Kuhn et al. | |
| 2014/0374827 A1 | 12/2014 | Suh et al. | |
| 2015/0035023 A1 | 2/2015 | Kim et al. | |
| 2015/0084134 A1 * | 3/2015 | Lin | H01L 21/823431 257/384 |
| 2015/0279960 A1 * | 10/2015 | Lee | H01L 27/092 438/283 |

FOREIGN PATENT DOCUMENTS

| | | |
|---|---|---|
| JP | 2000-022089 | 1/2000 |
| KR | 10-0857087 B1 | 9/2008 |
| WO | WO 2005-038931 | 4/2005 |

* cited by examiner

SEMICONDUCTOR DEVICE AND FABRICATING METHOD THEREOF

CROSS-REFERENCE TO RELATED APPLICATION

This application is a divisional of U.S. patent application Ser. No. 14/161,744, filed Jan. 23, 2014 and claims priority under 35 U.S.C. §119 from Korean Patent Application No. 10-2013-0008118, filed on Jan. 24, 2013 in the Korean Intellectual Property Office, the content of which is incorporated by reference herein in its entirety.

BACKGROUND

1. Technical Field

The present inventive concept relates to a semiconductor device and a fabricating method thereof.

2. Description of the Related Art

One scaling technique for increasing the density of a semiconductor device that has been proposed is the use of multi-gate transistors in which a semiconductor fin is formed on a substrate and a gate is formed on the surface of the semiconductor fin.

In such multi-gate transistors, a three-dimensional channel is used, which facilitates scaling the semiconductor device. Further, current control capability can be improved without increasing the gate length of the multi-gate transistor. In addition, a short channel effect (SCE) in which the potential of a channel region is affected by a drain voltage can be effectively suppressed.

SUMMARY

The present inventive concept provides a semiconductor device capable of reducing operating current consumption.

The present inventive concept also provides a fabricating method of a semiconductor device capable of reducing operating current consumption.

The objects of the present inventive concept are not limited thereto, and the other objects of the present inventive concept will be described in or be apparent from the following description of the embodiments.

According to an aspect of the present inventive concept, there is provided a semiconductor device that comprises a first fin on a substrate; a first gate electrode on the substrate that intersects the first fin; a first elevated source/drain on the first fin on a side of the first gate electrode; and a first metal alloy layer on an upper surface and sidewall of the first elevated source/drain.

According to another aspect of the present inventive concept, there is provided a semiconductor device that comprises a first fin on a substrate; a first gate electrode on the substrate that intersects the first fin; a first elevated source/drain on the first fin on a side of the first gate electrode; a contact on the first elevated source/drain opposite the first fin; and a first metal alloy layer along a periphery of the first elevated source/drain to be in direct contact with the first fin and the contact.

According to another aspect of the present inventive concept, there is provided a semiconductor device, the semiconductor device comprises a plurality of first fins on a substrate; a first gate electrode formed on the substrate to intersect the plurality of first fins; a plurality of first elevated sources/drains, respectively, formed on the plurality of first fins on both sides of the first gate electrode; a plurality of first metal alloy layers, respectively, formed on upper surfaces and sidewalls of the plurality of first elevated sources/drains; a contact hole simultaneously exposing portions of the plurality of first metal alloy layers; and a contact filling up the contact hole.

According to another aspect of the present inventive concept, there is provided a semiconductor device that comprises a substrate including a first region and a second region; a first fin type transistor in the first region that includes a first fin, a first gate electrode that intersects the first fin, a first elevated source/drain on the first fin on both sides of the first gate electrode, and a first metal alloy layer on an upper surface and sidewall of the first elevated source/drain; and a second fin type transistor in the second region that includes a second fin, a second gate electrode that intersects the second fin, a second elevated source/drain on the second fin on both sides of the second gate electrode, and a second metal alloy layer on an upper surface of the second elevated source/drain which is not formed on a sidewall of the second elevated source/drain.

According to another aspect of the present inventive concept, there is provided a semiconductor device that comprises a fin on a substrate; a gate electrode on the substrate and on the fin; an elevated source/drain on the fin and on a side of the gate electrode; a contact on the elevated source/drain opposite the fin; and a metal alloy layer on an exterior surface of the elevated source/drain that provides a primary electrical path between the fin and the contact.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

The present inventive concept will now be described more fully hereinafter with reference to the accompanying drawings, in which example embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to other element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

Figure 1:
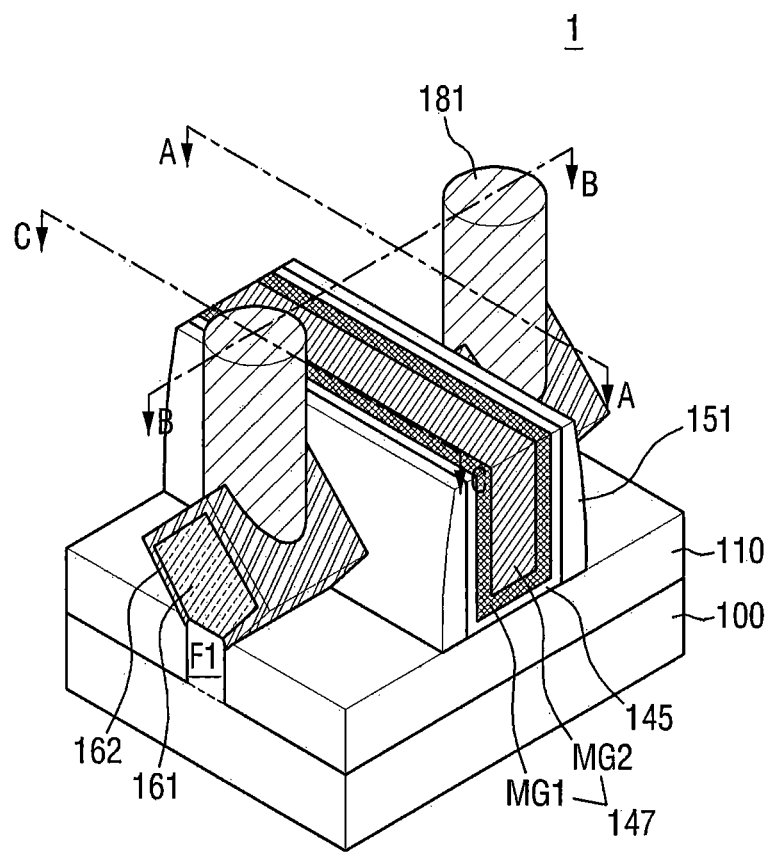
FIG. 1 is a perspective view illustrating a semiconductor device in accordance with a first embodiment of the present inventive concept.
Figure 2:
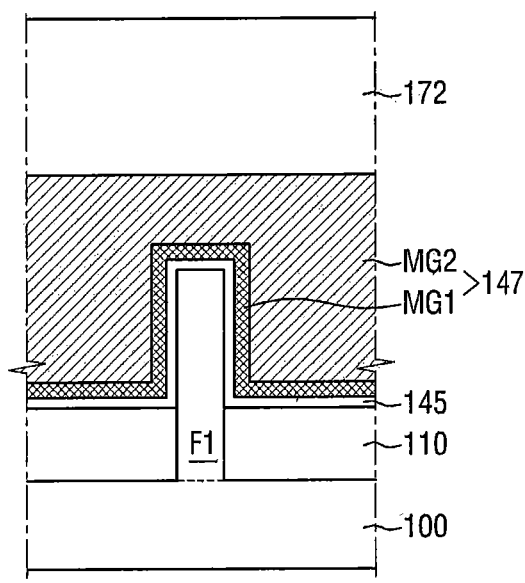
FIGS. 2, 3 and 4 are cross-sectional views of the semiconductor device of FIG. 1 taken along lines A-A, B-B and C-C of FIG. 1, respectively.
Figure 3:
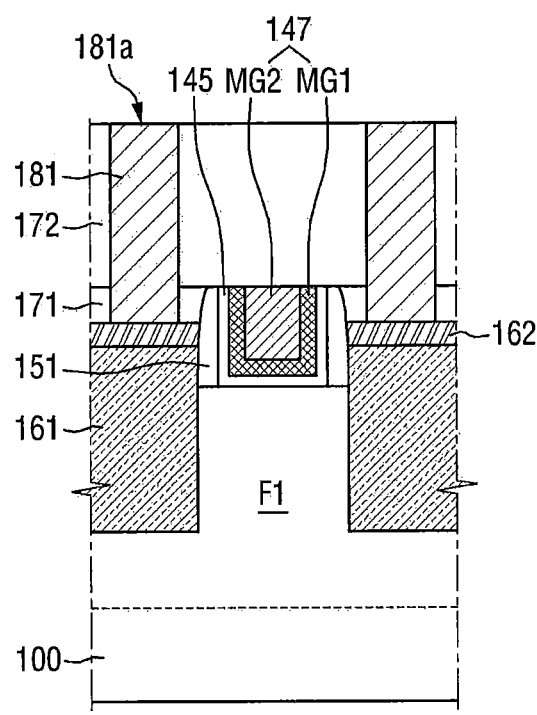
Figure 4:
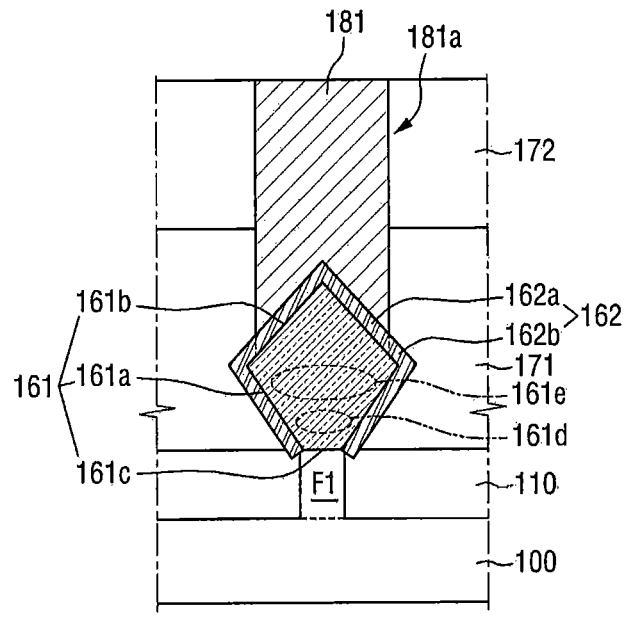
Figure 5:
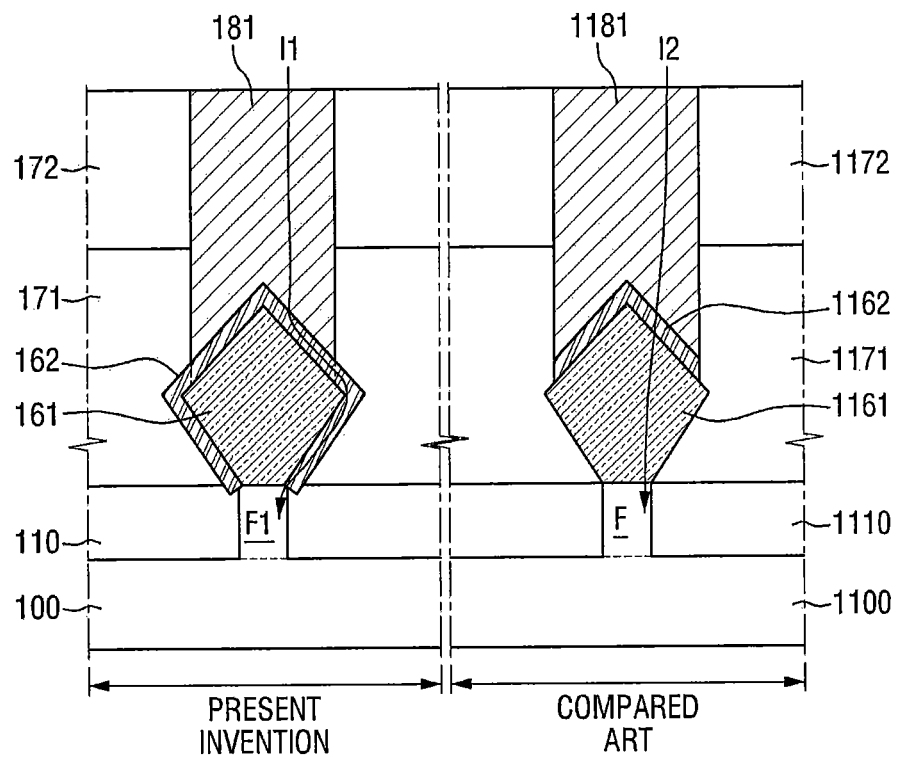
FIG. 5 is a pair of cross-sectional views that compare the first embodiment of the present invention to a prior art device.

FIG. 1 is a perspective view illustrating a semiconductor device 1 in accordance with a first embodiment of the present inventive concept. FIGS. 2, 3 and 4 are cross-sectional views of the semiconductor device taken along lines A-A, B-B and C-C of FIG. 1, respectively. FIG. 5 is a pair of cross-sectional views that compare the first embodiment of the present invention to a prior art device. To provide a more complete view of the semiconductor device 1, the first and second interlayer insulating films 171 and 172 are not illustrated in FIG. 1, but are shown in FIGS. 2-5.

First, referring to FIGS. 1 to 4, a semiconductor device 1 in accordance with the first embodiment of the present inventive concept may include a substrate 100, a first fin F1, a first gate electrode 147, a first elevated source/drain 161, a first metal alloy layer 162, a first contact 181, a first interlayer insulating film 171, a second interlayer insulating film 172 and the like.

The substrate 100 may be made of one or more semiconductor materials selected from the group consisting of Si, Ge, SiGe, GaP, GaAs, SiC, SiGeC, InAs and InP. Further, a silicon on insulator (SOI) substrate may be used.

The first fin F1 may be elongated along a second direction Y1. The first fin F1 may be a portion of the substrate 100, and/or may include an epitaxial layer grown from the substrate 100. An element isolation film 110 may cover side surfaces of the first fin F1.

The first gate electrode 147 may be formed on the first fin F1 to intersect the first fin F1. The first gate electrode 147 may extend along a first direction X1.

The first gate electrode 147 may include metal layers MG1 and MG2. The first gate electrode 147 may be formed by stacking two or more metal layers MG1 and MG2 as illustrated. The first metal layer MG1 may serve to adjust a work function, and the second metal layer MG2 may serve to fill up a space formed by the first metal layer MG1. For example, the first metal layer MG1 may include at least one of TiN, TaN, TiC and TaC, and the second metal layer MG2 may include W or Al. Alternatively, the first gate electrode 147 may be formed of Si, SiGe or the like rather than metal. The first gate electrode 147 may be formed through, e.g., a replacement process, but it is not limited thereto.

A first gate insulating film 145 may be formed between the first fin F1 and the first gate electrode 147. As shown in FIG. 2, the first gate insulating film 145 may be formed on the upper surface and an upper portion of the side surfaces of the first fin F1. Further, the first gate insulating film 145 may be arranged between the first gate electrode 147 and the element isolation film 110. The first gate insulating film 145 may include a high-dielectric constant (high-k) material with a dielectric constant higher than that of a silicon oxide film. For example, the first gate insulating film 145 may include $HfO_2$, $ZrO_2$ or $Ta_2O_5$.

A spacer 151 may include at least one of a nitride film and an oxynitride film. The spacer 151 may be on sidewalls of the first gate electrode 147 and on sidewalls of the gate insulating film 145.

The first elevated source/drain 161 may be formed on the first fin F1 on a side of the first gate electrode 147. Typically, first elevated source/drains 161 will be provided on first fin on each side of the first gate electrode 147.

The first elevated source/drain 161 may have various shapes. For example, the first elevated source/drain 161 may have at least one shape of a diamond shape, a circular shape, a rectangular shape or a shape having five or more sides. In FIGS. 1 and 4, a diamond shape (or pentagonal shape or hexagonal shape) has been illustrated as an example.

For example, the first elevated source/drain 161 may include a sidewall 161a, an upper surface 161b and a lower surface 161c as shown in FIG. 4. The lower surface 161c may be in contact with the first fin F1, and the sidewall 161a is an area connected to the lower surface 161c. Since the sidewall 161a is tilted depending on the shape, the sidewall 161a may not be visible when viewed from the upper side. That is, in FIG. 4, a right portion of the sidewall 161a may form an acute angle in a counterclockwise direction from the upper surface of the first fin F1. The upper surface 161b may be an area connected to the sidewall 161a, which may be in contact with the contact 181.

As shown in FIG. 4, the first elevated source/drain 161 may include a first portion 161d and a second portion 161e. The first portion 161d is closer to the first fin F1 than the second portion 161e, and the width of the first portion 161d may be smaller than the width of the second portion 161e.

If the semiconductor device 1 in accordance with the first embodiment of the present inventive concept is a PMOS transistor, the first elevated source/drain 161 may include a compressive stress material. For example, the compressive stress material may be a material, e.g., SiGe, with a lattice constant larger than that of Si. The compressive stress material may apply a compressive stress to the first fin F1 to improve the mobility of carriers in a channel region.

On the other hand, if the semiconductor device 1 is an NMOS transistor, the first elevated source/drain 161 may include the same material as that of the substrate 100, or a tensile stress material. For example, when the substrate 100 is made of Si, the first elevated source/drain 161 may include Si, or a material (e.g., SiC) with a lattice constant smaller than that of Si.

The first metal alloy layer 162 may be formed on the sidewall 161a and the upper surface 161b of the first elevated source/drain 161. Since the lower surface 161c of the first elevated source/drain 161 is in contact with the first fin F1, the first metal alloy layer 162 may not be formed on the lower surface 161c.

Although the sidewall 161a of the first elevated source/drain 161 is tilted, the first metal alloy layer 162 may be formed on the sidewall 161a. The first metal alloy layer 162 may include, e.g., silicide. As will be described later, after forming a metal layer on the first elevated source/drain 161 by a plating method, silicide may be formed by performing heat treatment to react the first elevated source/drain 161 with the metal layer, thereby forming the first metal alloy layer 162. Since a plating method is used, regardless of the shape of the first elevated source/drain 161, silicide may be formed on the sidewall 161a and the upper surface 161b of the first elevated source/drain 161. Depending on the type of the metal layer, electroless plating or electro-plating may be used.

Further, the first metal alloy layer 162 may include a non-contact surface 162b which is not in contact with the contact 181 as well as a contact surface 162a which is in contact with the contact 181. That is, the first metal alloy layer 162 may be also formed in an area which is not in contact with the contact 181.

The first metal alloy layer 162 may be formed along the periphery of the first elevated source/drain 161 and may be in direct contact with the first fin F1 and the contact 181, as is best shown in FIG. 4.

The contact 181 electrically connects wiring of the semiconductor device to the first elevated source/drain 161. Al, Cu, W or the like may be used in the contact 181, but it will be appreciated that additional or other materials may be used. The contact 181 may be formed to pass through the first interlayer insulating film 171 and the second interlayer insulating film 172, but it is not limited thereto. For example, as shown in FIG. 3, the upper surface of the first interlayer insulating film 171 may be coplanar with the upper surface of the first gate electrode 147. The upper surface of the first interlayer insulating film 171 may be formed to be coplanar with the upper surface of the first gate electrode 147 through a planarization process (e.g., a chemical-mechanical polishing process). The second interlayer insulating film 172 may be formed to cover the first gate electrode 147 and the first interlayer insulating film 171. The first interlayer insulating film 171 and the second interlayer insulating film 172 may include at least one of an oxide film, a nitride film, and an oxynitride film.

Hereinafter, an effect of the semiconductor device 1 in accordance with the first embodiment of the present inventive concept will be described with reference to FIG. 5.

Referring to FIG. 5, in the semiconductor device 1 (shown on the left side) in accordance with the first embodiment of the present inventive concept, the first metal alloy layer 162 may be formed along the periphery of the first elevated source/drain 161 to be in direct contact with the first fin F1 and the contact 181. In other words, the first metal alloy layer 162 may be formed on the sidewall 161a and the upper surface 161b of the first elevated source/drain 161.

Accordingly, in an operation of the semiconductor device 1 in accordance with the first embodiment of the present inventive concept, a current I1 may reach the first fin F1 mainly through the contact 181 and the first metal alloy layer 162. Only a small percentage of the current I1 may pass through the first elevated source/drain 161 as the first elevated source/drain 161 has a higher resistance than does the first metal alloy layer 162.

On the other hand, in a comparative device (shown on the right side of FIG. 5), a metal alloy layer 1162 is formed only on the upper surface of an elevated source/drain 1161. In other words, the metal alloy layer 1162 is formed only on a contact surface of the elevated source/drain 1161 that is in contact with a contact 1181. Thus, the metal alloy layer 1162 is in direct contact with the contact 1181, but is not in contact with a fin F, in the comparative device of FIG. 5.

Thus, in an operation of the device to be compared, a current I2 may reach the fin F through the contact 1181, the metal alloy layer 1162, and the elevated source/drain 1161. The current I2 needs to pass through the elevated source/drain 1161 with a higher resistance than that of the metal alloy layer 1162.

As a result, in the semiconductor device 1 in accordance with the first embodiment of the present inventive concept, since the first metal alloy layer 162 is in direct contact with the first fin F1 and the contact 181, the operating current consumption of the semiconductor device 1 may be low.

Figure 6:
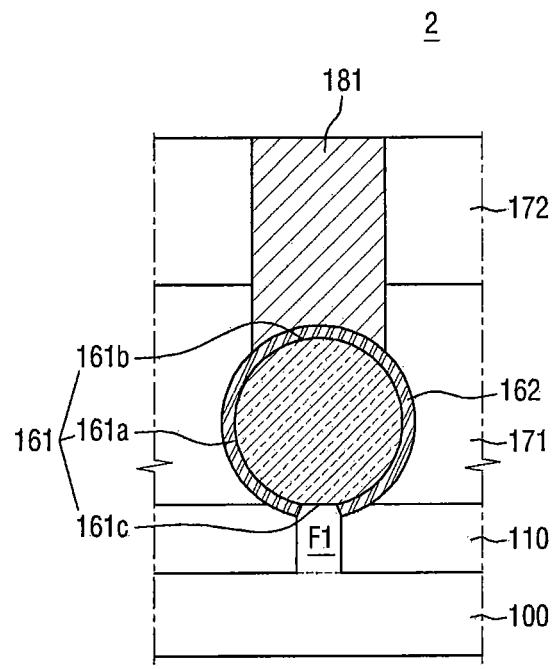
FIG. 6 is a cross-sectional view illustrating a semiconductor device in accordance with a second embodiment of the present inventive concept.

FIG. 6 is a cross-sectional view illustrating a semiconductor device in accordance with a second embodiment of the present inventive concept. For simplicity of description, the description of FIG. 6 will mainly focus on differences from the embodiment described with reference to FIGS. 1 to 5.

First, referring to FIG. 6, in a semiconductor device 2 in accordance with a second embodiment of the present inventive concept, the cross section of the first elevated source/drain 161 may have a circular shape. The first metal alloy layer 162 may be formed along the periphery of the first elevated source/drain 161 to be in direct contact with the first fin F1 and the contact 181.

Since the cross section of the first elevated source/drain 161 has a circular shape, the upper surface 161b and the sidewall 161a may be connected as a smooth curve, and the sidewall 161a and the lower surface 161c may be connected as a smooth curve.

Figure 7:
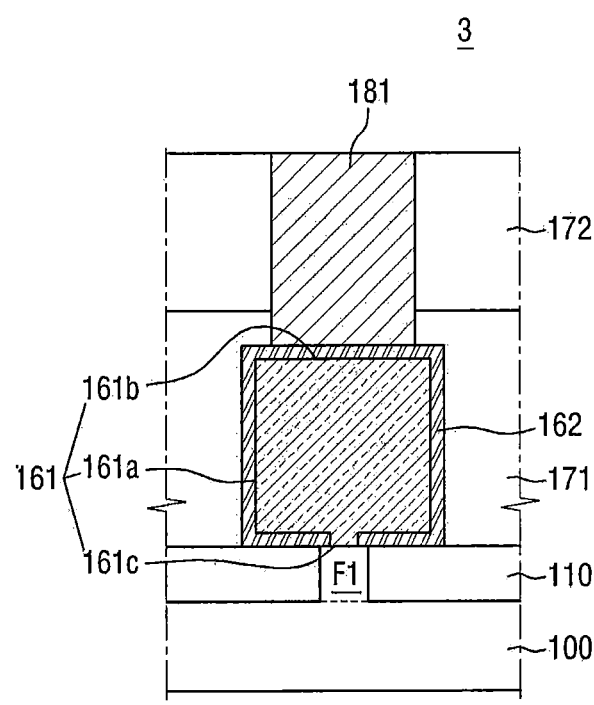
FIG. 7 is a cross-sectional view illustrating a semiconductor device in accordance with a third embodiment of the present inventive concept.

FIG. 7 is a cross-sectional view illustrating a semiconductor device in accordance with a third embodiment of the present inventive concept. For simplicity of description, the description of FIG. 7 mainly focuses on differences from the embodiment described with reference to FIGS. 1 to 5.

Referring to FIG. 7, in a semiconductor device 3 in accordance with a third embodiment of the present inventive concept, the cross section of the first elevated source/drain 161 may have a generally rectangular shape. The first elevated source/drain 161 may include the sidewall 161a, the upper surface 161b and the lower surface 161c. The sidewall 161a may be formed in a direction perpendicular to the upper surface of the substrate 100 (or the upper surface of the first fin F1). The contact 181 may be in contact with a portion of the upper surface 161b, and the first fin F1 may be in contact with a portion of the lower surface 161c. The first metal alloy layer 162 may be formed on the upper surface 161b and the sidewall 161a, and also formed on a portion of the lower surface 161c. For example, after forming the first elevated source/drain 161, a portion of the upper surface of the element isolation film 110 may be slightly etched, thereby forming an interval between the first elevated source/drain 161 and the element isolation film 110. Subsequently, by performing a silicide process, the first metal alloy layer 162 may be also formed on a portion of the lower surface 161c as well as the upper surface 161b and the sidewall 161a. Therefore, the first metal alloy layer 162 may be formed along the periphery of the first elevated source/drain 161 to be in direct contact with the first fin F1 and the contact 181.

Figure 8:
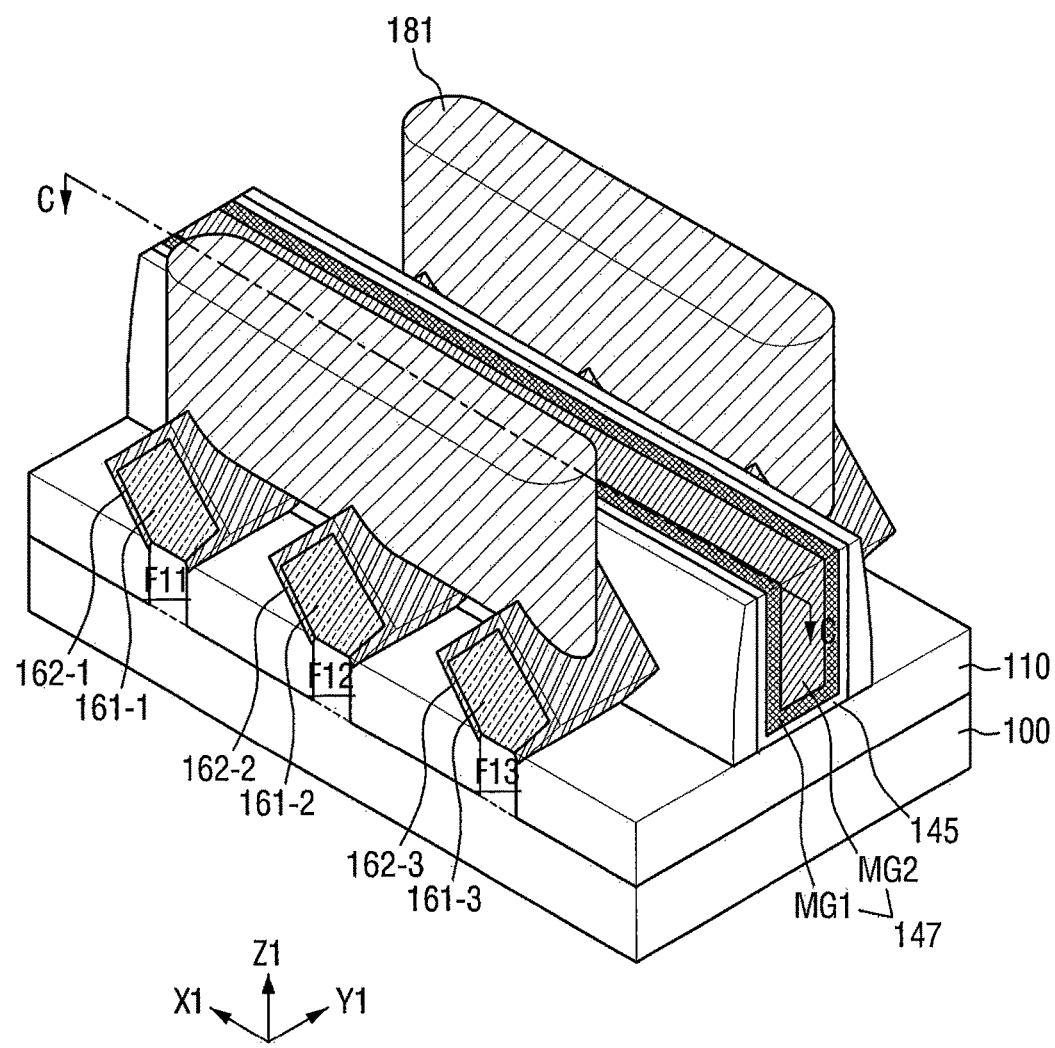
FIG. 8 is a perspective view illustrating a semiconductor device in accordance with a fourth embodiment of the present inventive concept.
Figure 9:
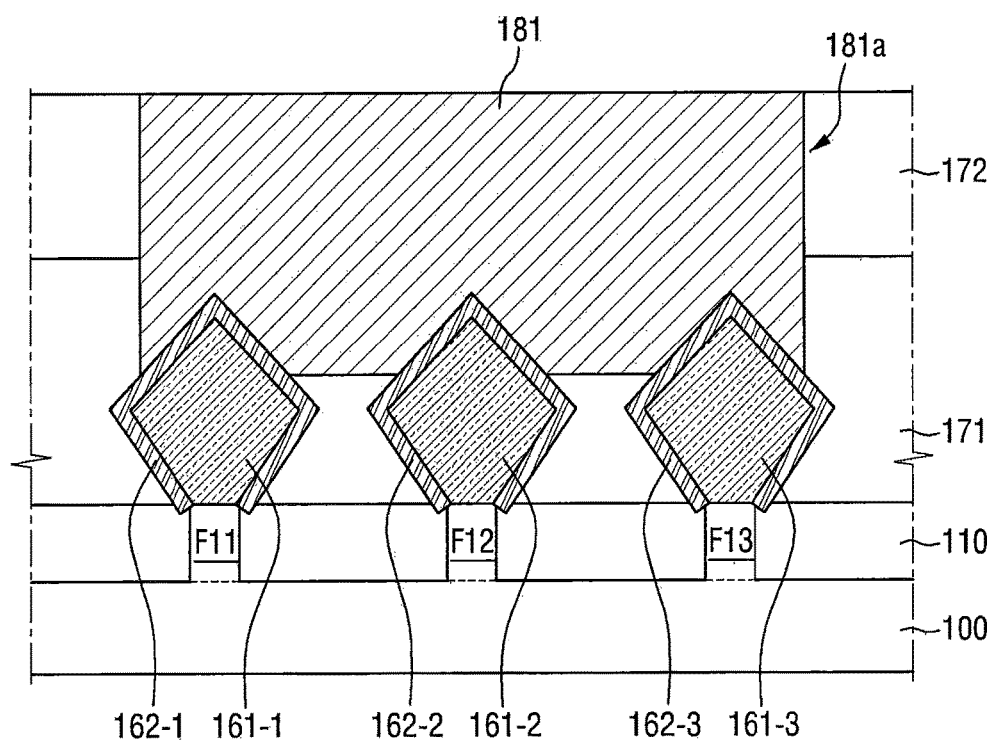
FIG. 9 is a cross-sectional view taken along line C-C of FIG. 8.

FIG. 8 is a perspective view illustrating a semiconductor device in accordance with a fourth embodiment of the present inventive concept. FIG. 9 is a cross-sectional view taken along line C-C of FIG. 8. For simplicity of description, the description of FIGS. 8 and 9 will mainly focus on differences from the embodiment described with reference to FIGS. 1 to 5.

Referring to FIGS. 8 and 9, in a semiconductor device 4 in accordance with the fourth embodiment of the present inventive concept, a plurality of first fins F11, F12 and F13 may extend along the second direction Y1 on the substrate 100. The first gate electrode 147 may be formed to intersect the plurality of first fins F11, F12 and F13. A plurality of first elevated sources/drains 161-1, 161-2 and 161-3 may be formed on the first fins F11, F12 and F13, respectively, on both sides of the first gate electrode 147. The first elevated sources/drains 161-1, 161-2 and 161-3 may have various shapes. For example, each of the first elevated sources/drains 161-1, 161-2 and 161-3 may have at least one shape of a diamond shape, a circular shape and a rectangular shape. Although a diamond shape (or pentagonal shape) has been illustrated as an example in FIG. 8, it is not limited thereto. Further, each of the first elevated sources/drains 161-1, 161-2 and 161-3 may include a sidewall, an upper surface and a lower surface. Since in some embodiments the sidewall may be tilted, the sidewall may not be visible when viewed from the upper side.

A plurality of first metal alloy layers 162-1, 162-2 and 162-3 may be formed on the upper surfaces and the sidewalls of the first elevated sources/drains 161-1, 161-2 and 161-3, respectively. In other words, the first metal alloy layers 162-1, 162-2 and 162-3 may be formed along the peripheries of the first elevated sources/drains 161-1, 161-2 and 161-3 to be in direct contact with their respective first fins F11, F12 and F13 and the contact 181. In this case, a contact hole 181a may be formed to expose respective portions of the upper surfaces of the first elevated sources/drains 161-1, 161-2 and 161-3. The contact 181 may be formed to fill up the contact hole 181a. Thus, the first fins F11, F12 and F13 may be electrically connected to the same contact 181.

Meanwhile, as illustrated, since the first elevated sources/drains 161-1, 161-2 and 161-3 are sufficiently spaced apart from each other, the first metal alloy layers 162-1, 162-2 and 162-3 can be also spaced apart from each other. Thus, the first interlayer insulating film 171 may be interposed between the first metal alloy layers 162-1, 162-2 and 162-3.

Figure 10:
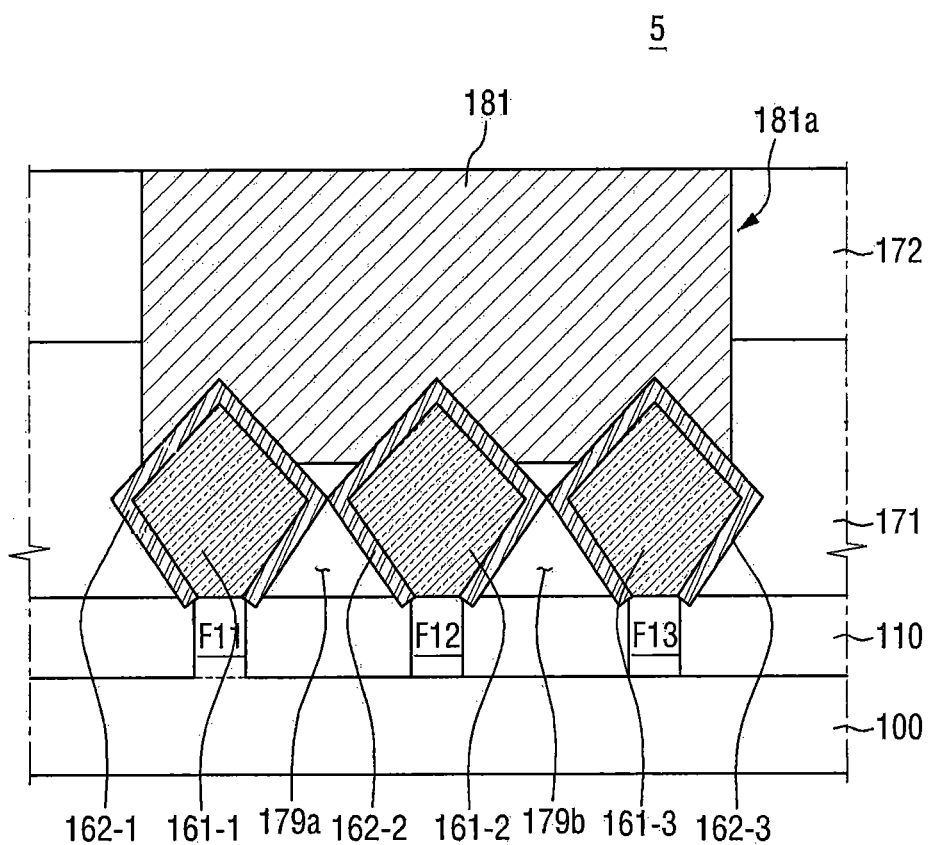
FIG. 10 is a perspective view illustrating a semiconductor device in accordance with a fifth embodiment of the present inventive concept.

FIG. 10 is a perspective view illustrating a semiconductor device in accordance with a fifth embodiment of the present inventive concept. For simplicity of description, the description of FIG. 10 will mainly focus on differences from the embodiment described with reference to FIGS. 8 and 9.

Referring to FIG. 10, in a semiconductor device 5 in accordance with the fifth embodiment of the present inventive concept, the first elevated sources/drains 161-1, 161-2 and 161-3 may not be sufficiently spaced apart from each other. Accordingly, as illustrated, each of the first metal alloy layers 162-1, 162-2 and 162-3 may be in direct contact with one or more of the other first metal alloy layers 162-1, 162-2 and 162-3. As a result, the first interlayer insulating film 171 may not be formed between the first metal alloy layers 162-1, 162-2 and 162-3 and instead air gaps 179a and 179b may be arranged between the first metal alloy layers 162-1, 162-2 and 162-3.

Figure 11:
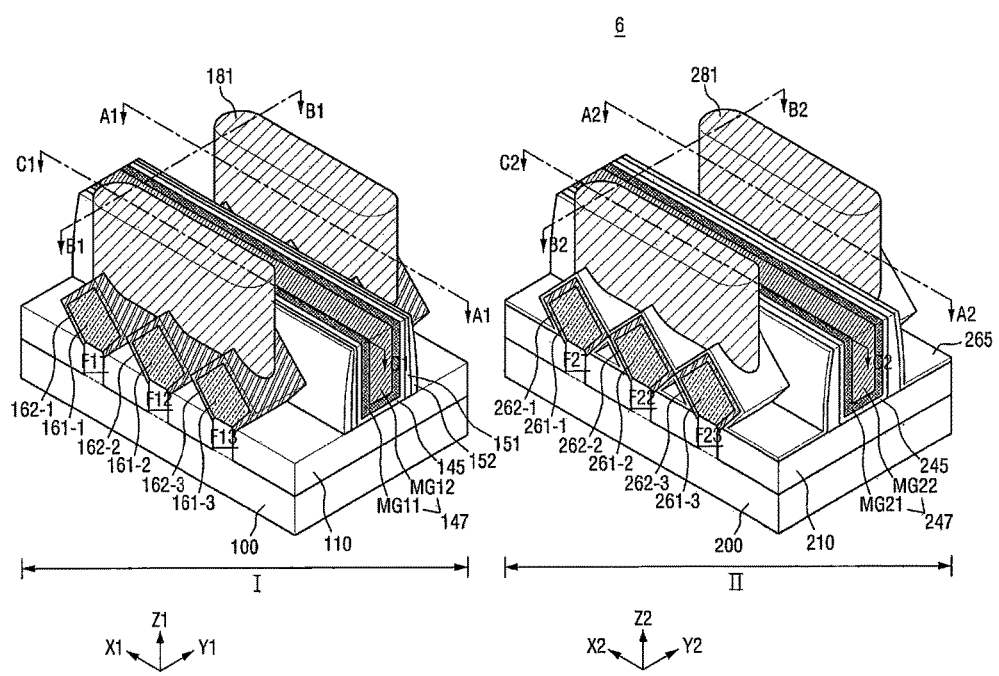
FIG. 11 is a perspective view illustrating a semiconductor device in accordance with a sixth embodiment of the present inventive concept.
Figure 12:
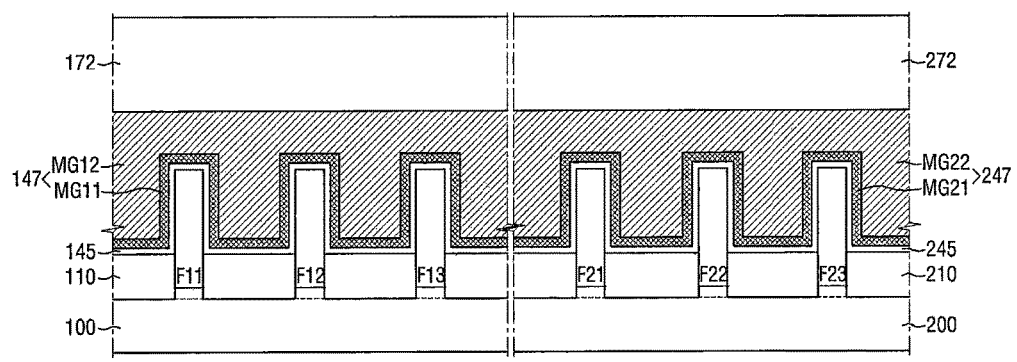
FIGS. 12, 13 and 14 are cross-sectional views of the semiconductor device of FIG. 11 taken along lines A-A, B-B and C-C of FIG. 11, respectively.
Figure 13:
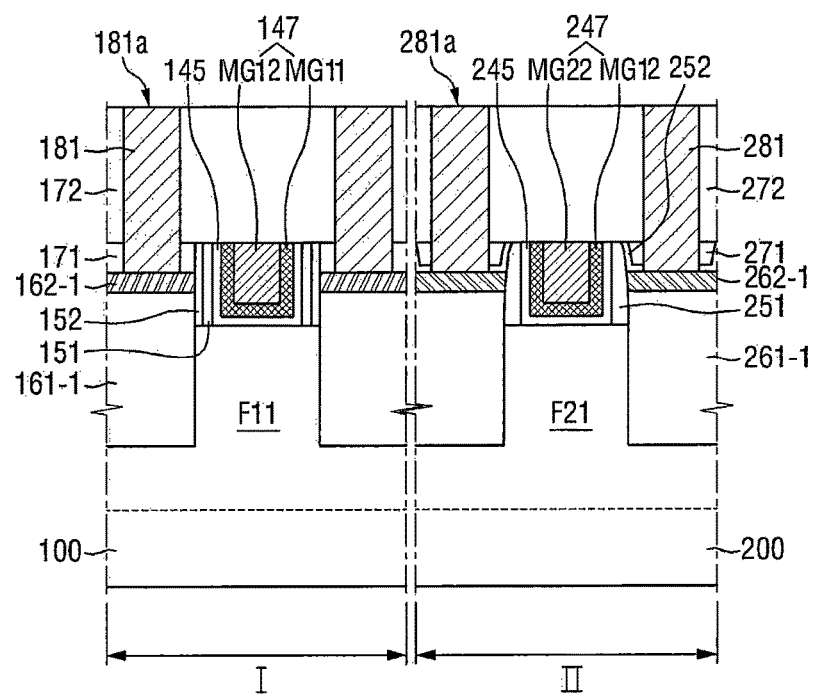
Figure 14:
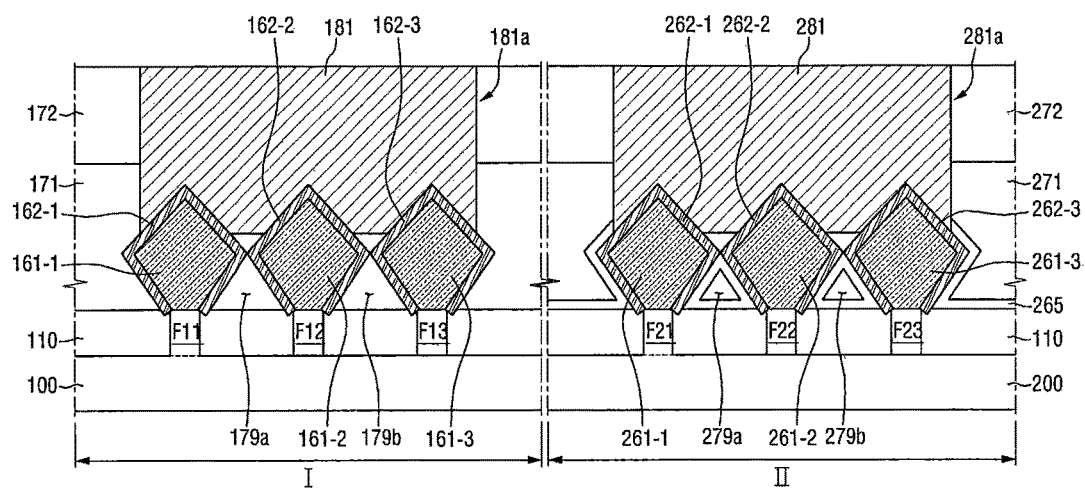

FIG. 11 is a perspective view illustrating a semiconductor device in accordance with a sixth embodiment of the present inventive concept. FIGS. 12, 13 and 14 are cross-sectional views of the semiconductor device taken along lines A-A, B-B and C-C of FIG. 11, respectively. For simplicity of description, first and second interlayer insulating films 171, 172 are not illustrated in FIG. 11. The description of the embodiment of FIGS. 11-14 will mainly focus on differences from the embodiment described with reference to FIGS. 1 to 5.

Referring to FIGS. 11 to 14, in a semiconductor device 6 in accordance with the sixth embodiment of the present inventive concept, the substrate 100 may include a first region I and a second region II. The first region I may be a region in which a first fin type transistor of a first conductivity type (e.g., n type) is formed, and the second region II may be a region in which a second fin type transistor of a second conductivity type (e.g., p type) that is different from the first conductivity type is formed.

The first fin type transistor formed in the first region I may include the first fins F11, F12 and F13, and the first gate electrode 147 may be formed to intersect the first fins F11, F12 and F13. The first elevated sources/drains 161-1, 161-2 and 161-3 are respectively formed on the first fins F11, F12 and F13 on both sides of the first gate electrode 147, and the first metal alloy layers 162-1, 162-2 and 162-3 are respectively formed on the upper surfaces and the sidewalls of the first elevated sources/drains 161-1, 161-2 and 161-3. The first fins F11, F12 and F13 may be elongated along the second direction Y1, and the first gate electrode 147 may extend in the first direction X1.

The second fin type transistor formed in the second region II may include a plurality of second fins F21, F22 and F23, a second gate electrode 247 formed to intersect the second fins F21, F22 and F23, a plurality of second elevated sources/drains 261-1, 261-2 and 261-3 respectively formed on the second fins F21, F22 and F23 on both sides of the second gate electrode 247, and a plurality of second metal alloy layers 262-1, 262-2 and 262-3 respectively formed on the upper surfaces and the sidewalls of the second elevated sources/drains 261-1, 261-2 and 261-3. The second fins F21, F22 and F23 may be elongated along a fifth direction Y2, and the second gate electrode 247 may extend in a fourth direction X2. The fourth direction X2, the fifth direction Y2 and a sixth direction Z2 may be parallel to the first direction X1, the second direction Y1 and a third direction Z1, respectively, but the present inventive concept is not limited thereto.

Since the first fin type transistor and the second fin type transistor have different conductivity types, the first elevated sources/drains 161-1, 161-2 and 161-3 and the second elevated sources/drains 261-1, 261-2 and 261-3 may be doped with different conductivity types.

The first metal alloy layers 162-1, 162-2 and 162-3 may be formed along the peripheries of the first elevated sources/drains 161-1, 161-2 and 161-3, respectively, to be in direct contact with the respective first fins F11, F12 and F13 and the first contact 181. The second metal alloy layers 262-1, 262-2 and 262-3 may be formed along the peripheries of the second elevated sources/drains 261-1, 261-2 and 261-3, respectively, to be in direct contact with the respective second fins F21, F22 and F23 and a second contact 281.

In this case, the first metal alloy layers 162-1, 162-2 and 162-3 and the second metal alloy layers 262-1, 262-2 and 262-3 may include different materials. When the first fin type transistor is a p-type transistor, for example, the first metal alloy layers 162-1, 162-2 and 162-3 may include at least one of Pt, Pd, NiB and NiPt. When the second fin type transistor is an n-type transistor, for example, the second metal alloy layers 262-1, 262-2 and 262-3 may include at least one of Co, Cr, W, Mo, Ta, Er and NiP.

In other embodiments, the first metal alloy layers 162-1, 162-2 and 162-3 and the second metal alloy layers 262-1, 262-2 and 262-3 may include the same material. In this case, the first metal alloy layers 162-1, 162-2 and 162-3 and the second metal alloy layers 262-1, 262-2 and 262-3 may include, for example, NiSi or TiSi.

The first contact 181 may be electrically connected to the first fins F11, F12 and F13, and the first contact 281 may be electrically connected to the second fins F21, F22 and F23.

Referring to FIG. 13, in the first region I, the upper surface of the first interlayer insulating film 171 is coplanar with the upper surface of the first gate electrode 147. For example, the upper surface of the first interlayer insulating film 171 may be formed to be coplanar with the upper surface of the first gate electrode 147 through a planarization process (e.g., CMP process). The second interlayer insulating film 172 may be formed to cover the first gate electrode 147. A first spacer 151 is formed at the sidewall of the first gate electrode 147. A second spacer 152 may be formed along the side surface of the first spacer 151. That is, the second spacer 152 may be formed in an I shape rather than an L shape.

In the second region II, the upper surface of a third interlayer insulating film 271 may be coplanar with the upper surface of the second gate electrode 247. For example, the upper surface of the third interlayer insulating film 271 may be formed to be coplanar with the upper surface of the second gate electrode 247 through a planarization process (e.g., CMP process). A fourth interlayer insulating film 272 may be formed to cover the second gate electrode 247. A third spacer 251 is formed at the sidewall of the second gate electrode 247. A fourth spacer 252 may be formed along the upper surface of a second metal alloy layer 262 and the side surface of the third spacer 251. That is, the fourth spacer 252 may have an L shape.

The first spacer 151 and the third spacer 251 may include the same material, and the third spacer 251 and the fourth spacer 252 may include the same material. This is due to a manufacturing process (see FIG. 30 and its description and FIG. 32 and its description to be described later).

Referring to FIG. 14, the second fin type transistor formed in the second region II may further include a sidewall insulating film 265. The sidewall insulating film 265 is disposed between the second metal alloy layers 262-1, 262-2 and 262-3 and the third interlayer insulating film 271, and may be formed conformally along the sidewalls of the second metal alloy layers 262-1, 262-2 and 262-3. As illustrated, the sidewall insulating film 265 may be formed on a portion of the upper surfaces of the second metal alloy layers 262-1, 262-2 and 262-3. The second metal alloy layers 262-1, 262-2 and 262-3 may include at least one of an oxide film, a nitride film, and an oxynitride film.

The second elevated sources/drains 261-1, 261-2 and 261-3 may not be sufficiently spaced apart from each other. Accordingly, as illustrated, each of the second metal alloy layers 262-1, 262-2 and 262-3 may be in direct contact with one or more of the other second metal alloy layers 262-1, 262-2 and 262-3. As a result, the third interlayer insulating film 271 may not be formed between the second metal alloy layers 262-1, 262-2 and 262-3 and instead air gaps 279a and 279b may be arranged between the second metal alloy layers 262-1, 262-2 and 262-3.

Figure 15:
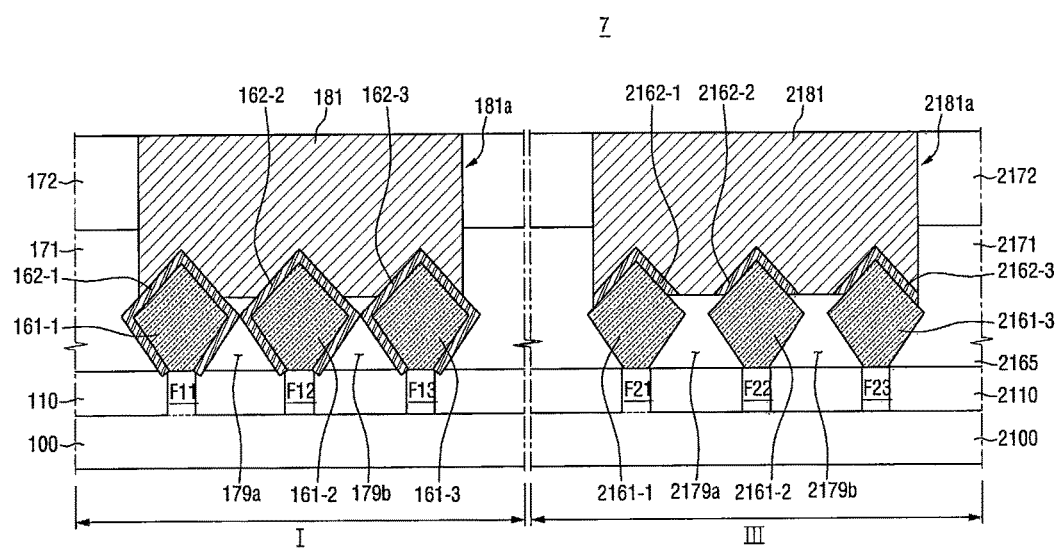
FIG. 15 is a perspective view illustrating a semiconductor device in accordance with a seventh embodiment of the present inventive concept.
Figure 16:
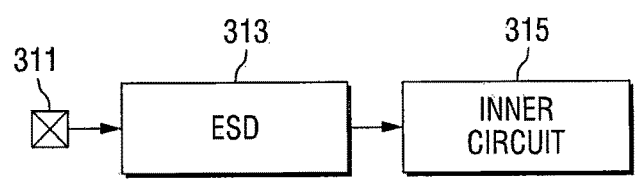
FIG. 16 is an exemplary block diagram illustrating a third region III of the semiconductor device of FIG. 15.

FIG. 15 is a perspective view illustrating a semiconductor device in accordance with a seventh embodiment of the present inventive concept. FIG. 16 is an exemplary block diagram for explaining a third region III of FIG. 15.

First, referring to FIG. 15, in a semiconductor device 7 in accordance with the seventh embodiment of the present inventive concept, the substrate 100 may include the first region I and the third region III.

In the first region I, the first metal alloy layers 162-1, 162-2 and 162-3 may be formed on the upper surfaces and the sidewalls of the first elevated sources/drains 161-1, 161-2 and 161-3, respectively. The first metal alloy layers 162-1, 162-2 and 162-3 may be formed along the peripheries of the first elevated sources/drains 161-1, 161-2 and 161-3, respectively, so that they directly contact both the first fins F11, F12 and F13 and the contact 181. The contact hole 181a may be formed to expose a portion of the upper surfaces of the first elevated sources/drains 161-1, 161-2 and 161-3. The contact 181 may be formed in the contact hole 181a and may substantially fill up the contact hole 181a. Accordingly, each of the first fins F11, F12 and F13 may be electrically connected to the same contact 181.

In contrast, in the third region III, a plurality of third metal alloy layers 2162-1, 2162-2 and 2162-3 may be formed only on the upper surfaces of a plurality of third elevated sources/drains 2161-1, 2161-2 and 2161-3, respectively. In other words, the third metal alloy layers 2162-1, 2162-2 and 2162-3 are formed only on contact surfaces of the third elevated sources/drains 2161-1, 2161-2 and 2161-3, which are in contact with a third contact 2181. Accordingly, the third metal alloy layers 2162-1, 2162-2 and 2162-3 are in direct contact with the third contact 2181, but are not in direct contact with the fins F21, F22, F23.

For example, the third region III may be an electrostatic discharge (ESD) circuit area of an input/output device. That is, in a fin type transistor constituting an ESD, the third metal alloy layers 2162-1, 2162-2 and 2162-3 may be formed only on the upper surfaces of the respective third elevated sources/drains 2161-1, 2161-2 and 2161-3. In this case, referring to FIG. 16, the input/output device may include an input/output pad 311, an ESD 313, an inner circuit 315 and the like. The ESD 313 is an electrostatic discharge protection circuit block. That is, when an instantaneously or near-instantaneous high bias (positive or negative bias) is applied to the input/output pad 311, the high bias is discharged, for example, in a direction toward a ground voltage to protect the inner circuit 315.

Hereinafter, a method of fabricating the semiconductor device in accordance with the first embodiment of the present inventive concept will be described with reference to FIGS. 17 to 28. FIGS. 17 to 28 are perspective diagrams showing intermediate steps that illustrate the a method of fabricating the semiconductor device in accordance with the first embodiment of the inventive concept.

Figure 17:
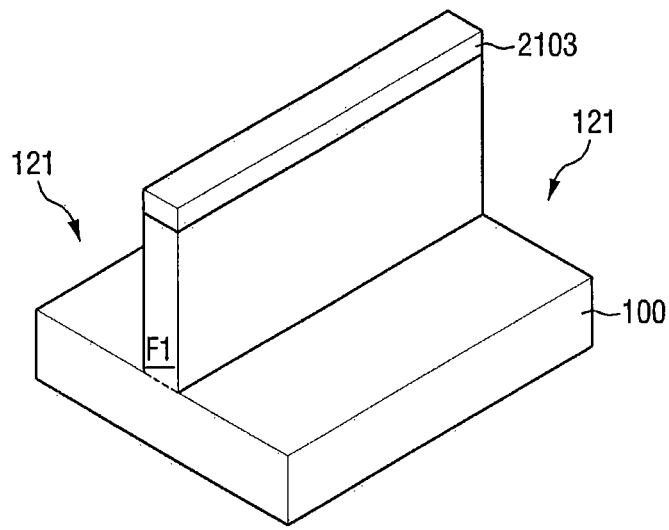
FIGS. 17 to 28 are diagrams showing intermediate steps of a fabricating method of the semiconductor device in accordance with the first embodiment of the present inventive concept.
Figure 17:
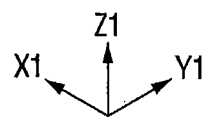

Referring to FIG. 17, the first fin F1 is formed on the substrate 100.

Specifically, after a mask pattern 2103 is formed on the substrate 100, the first fin F1 is formed by performing an etching process using the mask pattern 2103 as an etching mask. The first fin F1 may extend along the second direction Y1. A trench 121 is formed around the first fin F1 via the etching process. The mask pattern 2103 may be formed of a material containing at least one of a silicon oxide film, a silicon nitride film, and a silicon oxynitride film.

Figure 18:
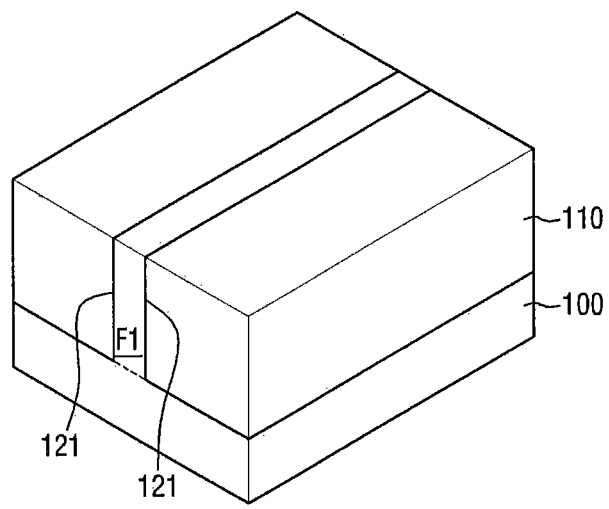
Figure 18:
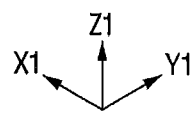

Referring to FIG. 18, the element isolation film 110 is formed to fill up the trench 121. The element isolation film 110 may be formed of a material containing at least one of a silicon oxide film, a silicon nitride film, and a silicon oxynitride film.

Figure 19:
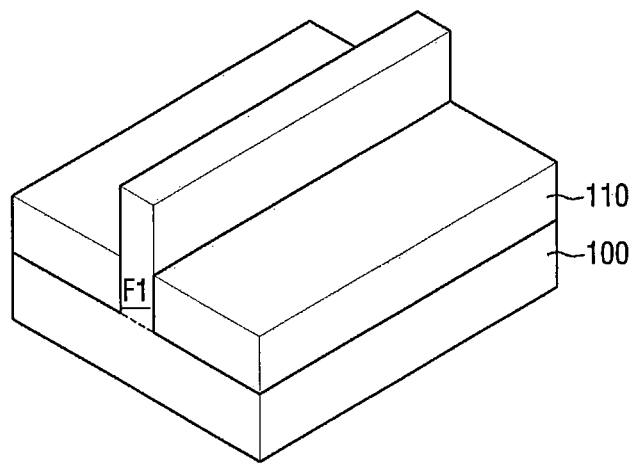

Referring to FIG. 19, an upper portion of the element isolation film 110 is recessed to expose an upper portion of the first fin F1. A recess process may include a selective etching process. The mask pattern 2103 may be removed before forming the element isolation film 110, or after the recess process.

In some embodiments, a portion of the first fin F1 that protrudes upward above the element isolation film 110 may be formed by an epitaxial process. Specifically, after forming the element isolation film 110, a portion of the first fin F1 may be formed by an epitaxial growth process using the upper surface of the first fin F1 that is exposed by the element isolation film 110 as a seed. In such embodiments, it may not be necessary to recess the element isolation film 110.

Additionally, the first fin F1 may be doped in order to adjust a threshold voltage of the fin type transistor 101 that is being formed. If the fin type transistor 101 is an NMOS transistor, impurities such as boron (B) may be doped into the first fin F1 by any appropriate method (e.g., ion implantation, doping during growth, diffusion, etc.). If the fin type transistor 101 is a PMOS transistor, the impurities may be, for example, phosphorus (P) or arsenic (As).

Figure 20:
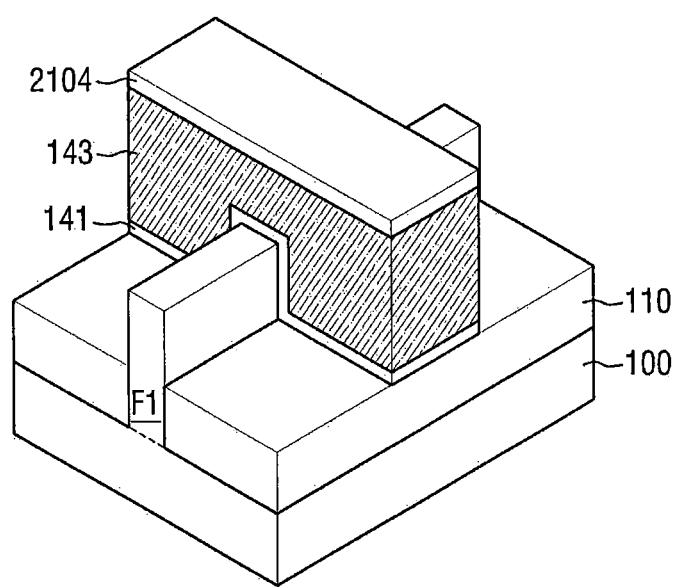

Referring to FIG. 20, by performing deposition processes and an etching process using a mask pattern 2104, a first dummy gate insulating film 141 and a first dummy gate electrode 143 may be formed that extend in the first direction X1 to intersect the first fin F1.

For example, the first dummy gate insulating film 141 may be a silicon oxide film, and the first dummy gate electrode 143 may be made of polysilicon.

Figure 21:
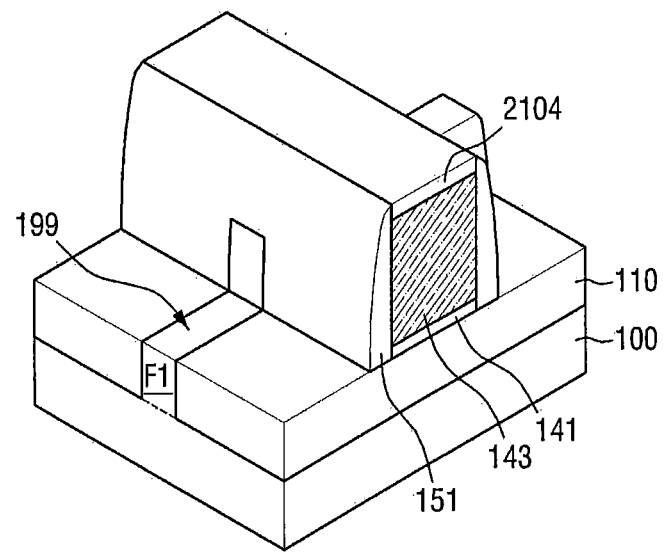

Referring to FIG. 21, the first spacer 151 may be formed on the sidewalls of the first dummy gate electrode 143. The first spacer 151 may cover the sidewalls of the mask pattern 2104 but may leave the upper surface of the mask pattern 2104 exposed. The first spacer 151 may be, for example, a silicon nitride film or a silicon oxynitride film.

Subsequently, a recess 199 is formed by removing portions of the first fin F1 that are exposed on both sides of the first dummy gate electrode 143.

Figure 22:
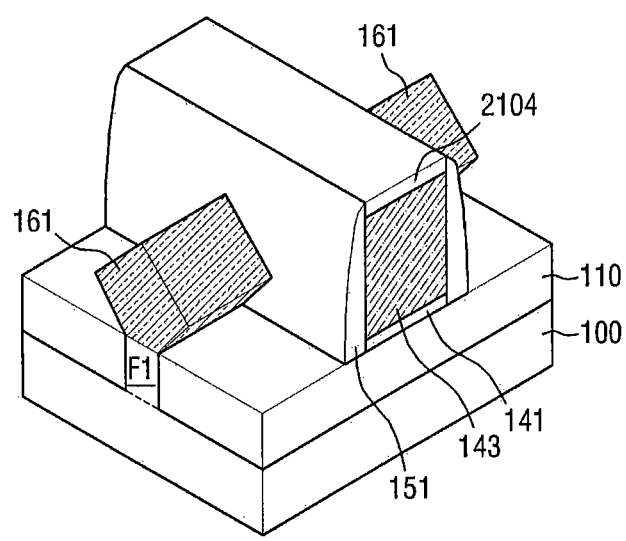

Referring to FIG. 22, the first elevated source/drains 161 are formed on the first fin F1 (i.e., in the recess 199) on either side of the dummy gate electrode 143.

The first elevated source/drains 161 may be formed by an epitaxial growth process. A material of the first elevated source/drains 161 may vary depending on whether the semiconductor device 1 in accordance with the first embodiment of the present inventive concept is an n-type transistor or p-type transistor. Further, if necessary, impurities may be doped by, for example, in-situ doping during the epitaxial growth process.

The first elevated source/drains 161 may have at least one shape of, for example, a diamond shape, a circular shape and a rectangular shape. In FIG. 22, a diamond shape (or pentagonal shape or hexagonal shape) has been illustrated as an example.

Figure 23:
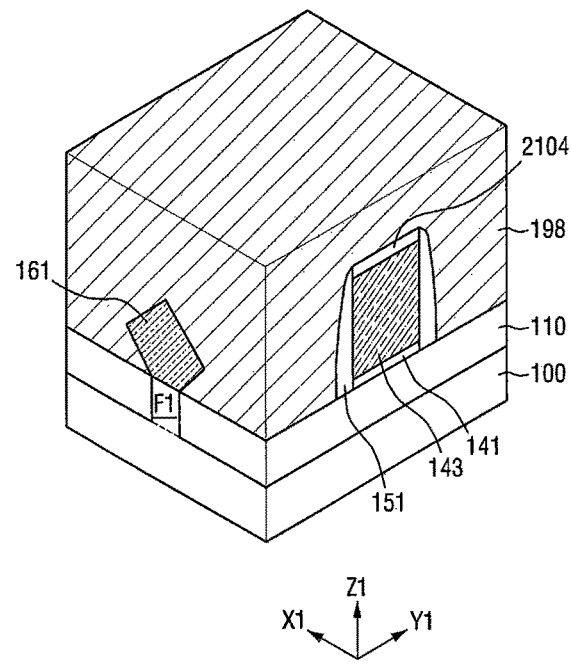

Referring to FIG. 23, a metal layer 198 is formed on the first elevated source/drains 161.

Specifically, the metal layer 198 may be formed on the first dummy gate electrode 143 and the element isolation film 110 as well as the first elevated source/drains 161. The metal layer 198 may be formed by electroless plating. Electroless plating has excellent coverage characteristics. Since the electroless plating has no selectivity, it is necessary to remove an unreacted metal layer after forming silicide (see FIG. 25).

A material capable of being plated by electroless plating by itself may be Co, Ni, Cu, Ru, Rh, Pd, Ag, Cd, In, Sn, Sb, Pt, Au, Pb, Bi or the like.

A material capable of being plated by electroless plating in the form of alloy may be V, Cr, Mn, Fe, Mo, W, Re, Tl, B, P, As or the like.

The principle of electroless plating may be described as follows. In this case, R refers to a reductant.

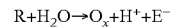

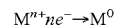

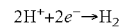

Specifically, if the metal layer 198 is made of Ni, electroless plating is conducted as follows. It is possible to plate Ni on most types of metal, plastic and ceramic by electroless plating.

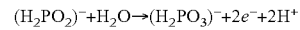

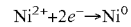

As another example, if the metal layer 198 is made of Ni—P alloy, electroless plating is conducted as follows.

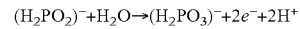

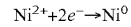

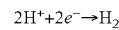

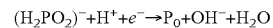

As still another example, if the metal layer 198 is made of Pd, electroless plating is conducted as follows. The Pd electroless plating is of a replacement type.

$$Cu^0 \rightarrow Cu^{2+} + 2e^-$$

$$Pd^{2+} + 2e^- \rightarrow Pd^0$$

As still another example, if the metal layer 198 is made of Pt, electroless plating is conducted as follows. The Pt electroless plating may be performed by using $Pt(NH_3)_2(NO_2)_2$, and it is possible to perform Pt electroless plating on ceramics.

$$Cu^0 \rightarrow Cu^{2+} + 2e^-$$

$$2Pt^{2+} + N2H4 + 4OH^- \rightarrow 2Pt^0 + 4H^+ + 4OH^-$$

Meanwhile, the metal layer 198 may be formed by electro-plating. Since electro-plating has selectivity, it is unnecessary to remove an unreacted metal layer after forming silicide.

Materials capable of being plated in an aqueous solution by electro-plating include Cr, Mn, Fe, Co, Ni, Cu, Zn, Ga, Ge, As, Ru, Rh, Pd, Ag, Cd, In, Sn, Sb, Os, Ir, Pt, Au, Hg, Tl, Pb, Bi, Po and the like.

Materials capable of being plated in the form of alloy by electro-plating include Ti, V, Mo, W, Re, B, C, Al, Si, P, S, Se and the like.

Materials capable of being plated in a non-aqueous solution by electro-plating include Li, Be, Na, Mg, K, Ca, Rb, Sr, Cs, Ba, Fr, Ra, Mo, Al and the like.

Further, a material of the metal layer 198 may vary depending on whether the semiconductor device 1 in accordance with the first embodiment of the present inventive concept is an n-type transistor or a p-type transistor. For example, if the semiconductor device 1 is an n-type transistor, the metal layer 198 may be made of, e.g., Co, Cr, W, Mo, Ta, Er, NiP or the like, but it is not limited thereto. If the semiconductor device 1 is a p-type transistor, the metal layer 198 may be made of, e.g., Pt, Pd, NiB, NiPt or the like, but it is not limited thereto. The aforementioned materials capable of being plated by electroless plating/electro-plating may be used as needed.

Figure 24:
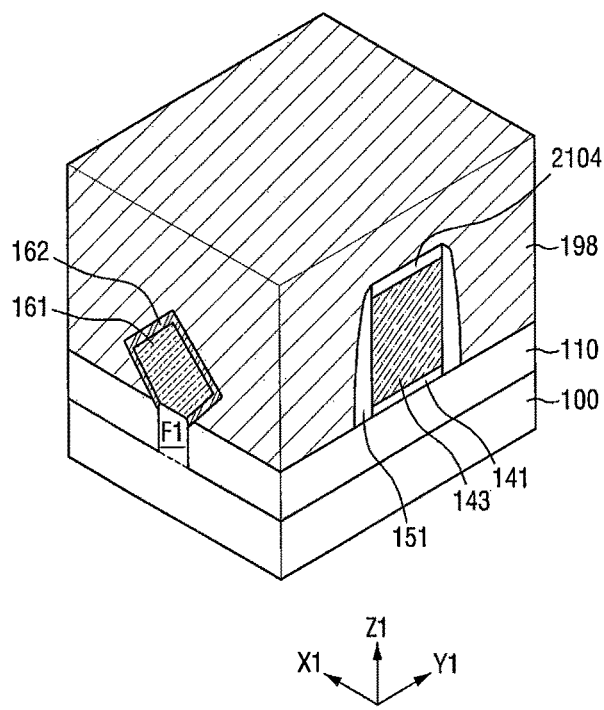

Referring to FIG. 24, the first metal alloy layers 162 (i.e., silicide) is formed by performing heat treatment to react the first elevated source/drains 161 with the metal layer 198. The temperature/time and the like of the heat treatment can be adjusted according to various conditions such as the material of the metal layer 198 and the thickness of the first metal alloy layers 162.

Figure 25:
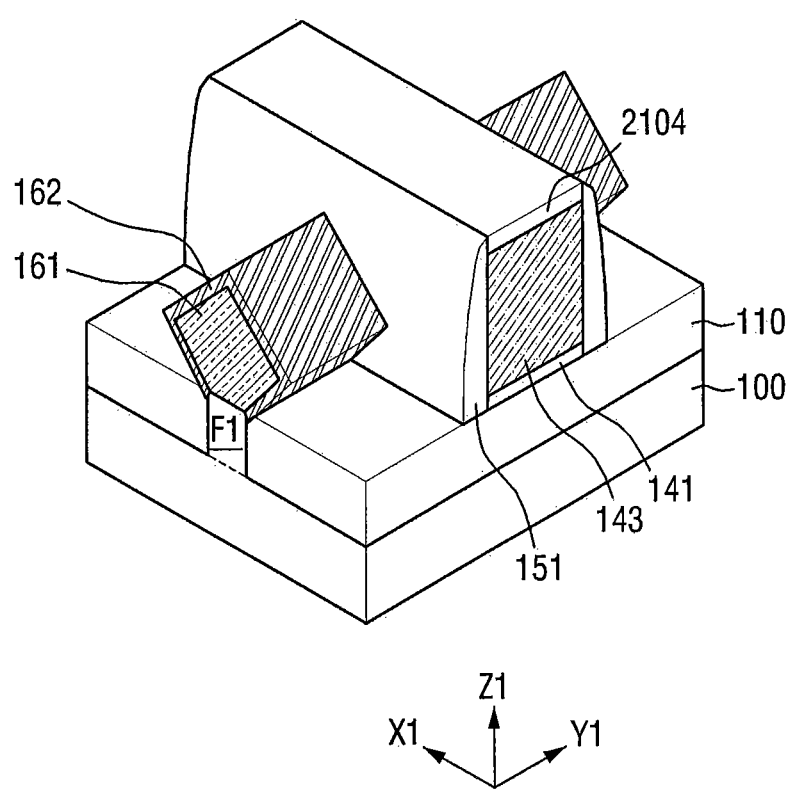

Referring to FIG. 25, during the heat treatment, the unreacted metal layer 198 is removed.

Figure 26:
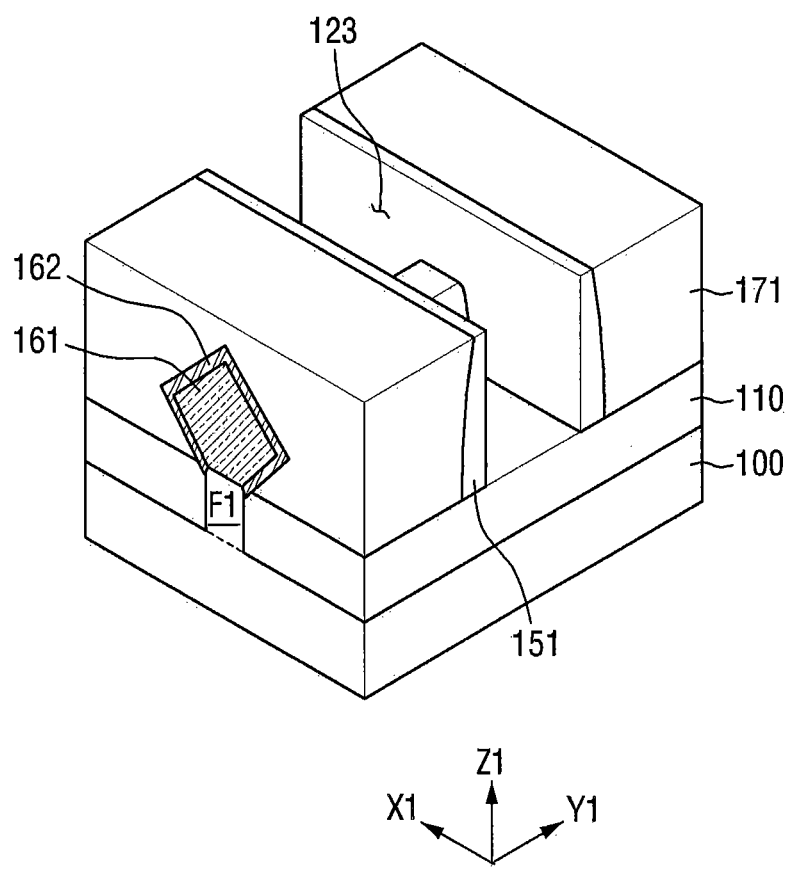

Referring to FIG. 26, the first interlayer insulating film 171 is formed on a resultant structure of FIG. 25. The first interlayer insulating film 171 may be at least one of an oxide film, a nitride film, and an oxynitride film.

Subsequently, the first interlayer insulating film 171 is planarized until the upper surface of the first dummy gate electrode 143 is exposed. The mask pattern 2104 may then be removed to expose the upper surface of the first dummy gate electrode 143.

Subsequently, the first dummy gate insulating film 141 and the first dummy gate electrode 143 are removed. By removing the first dummy gate insulating film 141 and the first dummy gate electrode 143, a trench 123 is formed to expose the element isolation film 110.

Figure 27:
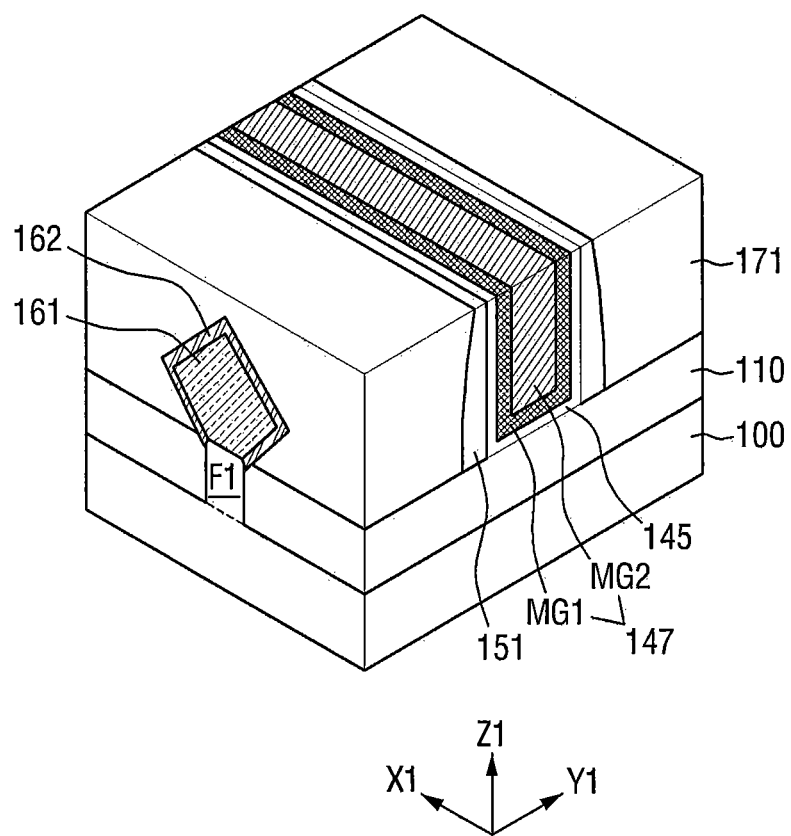

Referring to FIG. 27, the first gate insulating film 145 and the first gate electrodes 147 are formed in the trench 123.

The first gate insulating film 145 may include a high-dielectric constant (high-k) material with a dielectric constant higher than that of a silicon oxide film. For example, the first gate insulating film 145 may include $HfO_2$, $ZrO_2$ or $Ta_2O_5$. The first gate insulating film 145 may be formed substantially conformally along the sidewall and the lower surface of the trench 123.

The first gate electrode 147 may include the metal layers MG1 and MG2. As illustrated, the first gate electrode 147 may be formed by stacking two or more metal layers MG1 and MG2. The first metal layer MG1 may serve to adjust a work function, and the second metal layer MG2 may serve to fill up a space formed by the first metal layer MG1. For example, the first metal layer MG1 may include at least one of TiN, TaN, TiC and TaC. Further, the second metal layer MG2 may include W or Al. Alternatively, the first gate electrode 147 may be formed of Si, SiGe or the like rather than metal.

Figure 28:
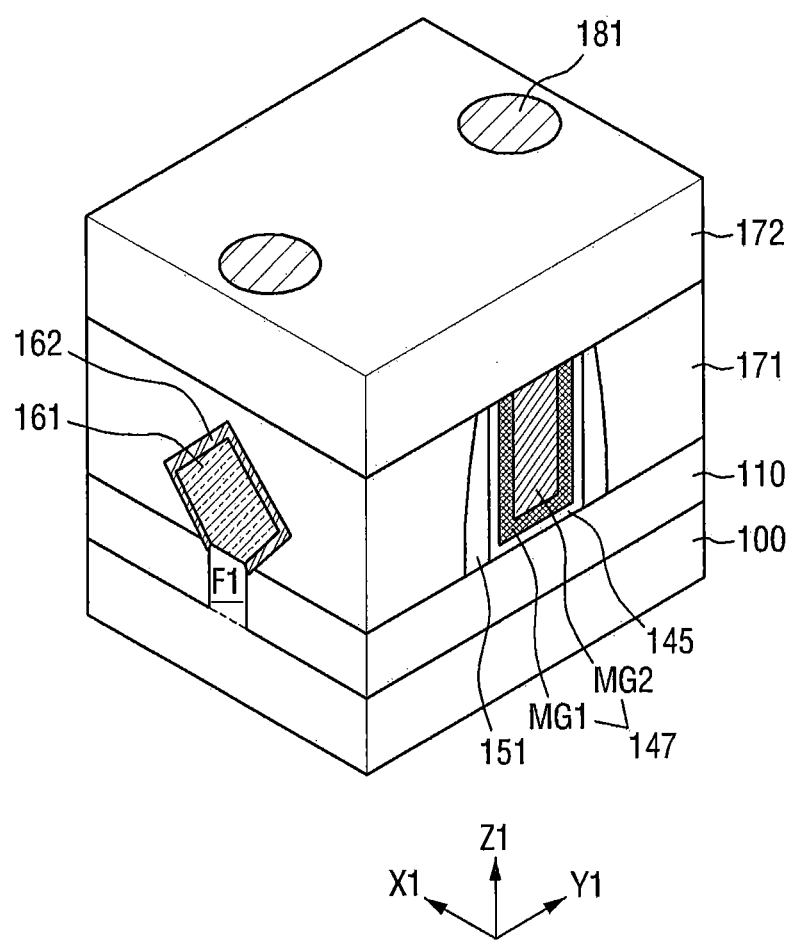

Referring to FIG. 28, the second interlayer insulating film 172 is formed on the resultant structure of FIG. 27. The second interlayer insulating film 172 may be, e.g., at least one of an oxide film, a nitride film, and an oxynitride film.

Subsequently, contact holes 181a are formed to pass through the first interlayer insulating film 171 and the second interlayer insulating film 172 to expose portion (i.e., upper surfaces) of the first metal alloy layers 162.

Subsequently, contacts 181 are formed in the respective contact holes 181a to substantially fill up the contact holes 181a.

Hereinafter, a fabricating method of the semiconductor device in accordance with the sixth embodiment of the present inventive concept will be described with reference to FIGS. 29 to 35. FIGS. 29 to 35 are diagrams showing intermediate steps that illustrate the fabricating method of the semiconductor device in accordance with the sixth embodiment of the present inventive concept. For simplicity of description, the description will mainly focus on differences from the embodiment described with reference to FIGS. 17 to 28.

Figure 29:
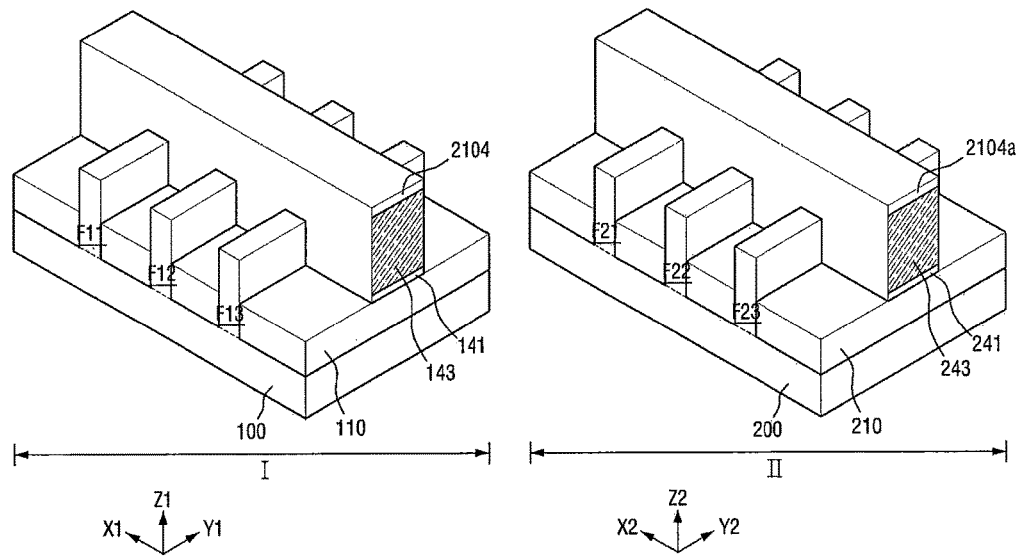
FIGS. 29 to 35 are diagrams showing intermediate steps of a fabricating method of the semiconductor device in accordance with the sixth embodiment of the present inventive concept.

Referring to FIG. 29, the first region I and the second region II are defined in the substrate 100. The first region I may be a region in which a first fin type transistor of a first conductivity type (e.g., n type) is formed, and the second region II may be a region in which a second fin type transistor of a second conductivity type (e.g., p type) that is different from the first conductive type is formed.

In the first region I, a plurality of first fins F11, F12 and F13 are formed and the first dummy gate electrode 143 is formed to intersect the first fins F11, F12 and F13. A first dummy gate insulating film 141 may be located below the first dummy gate electrode 143, and a mask pattern 2104 may be located on the first dummy gate electrode 143.

In the second region II, a plurality of second fins F21, F22 and F23 are formed and a second dummy gate electrode 243 is formed to intersect the second fins F21, F22 and F23. A second dummy gate insulating film 241 may be located below the second dummy gate electrode 243, and a mask pattern 2104a may be located on the second dummy gate electrode 243.

Figure 30:
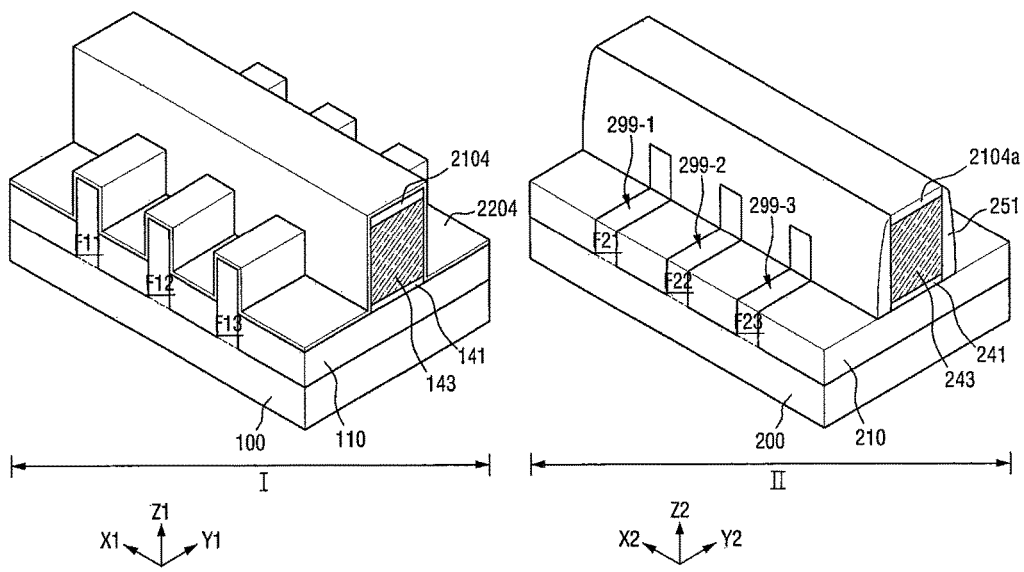

Referring to FIG. 30, a mask film 2204 is formed to cover the first region I. In the second region II, the third spacer 251 is formed on the sidewall of the second dummy gate electrode 243. Specifically, a first insulating film is formed on the first region I and the second region II, and the first insulating film formed in the second region II is etched back without etching the first insulating film formed in the first region I. Thus, the mask film 2204 may be formed in the first region I, and the third spacer 251 may be formed in the second region II. The third spacer 251 may be formed on the sidewall of the second dummy gate electrode 243 but may leave the upper surface of the mask pattern 2104a exposed.

Subsequently, a plurality of recesses 299-1, 299-2 and 299-3 are formed by removing portions of the second fins F21, F22 and F23 that are exposed on both sides of the second dummy gate electrode 243.

Figure 31:
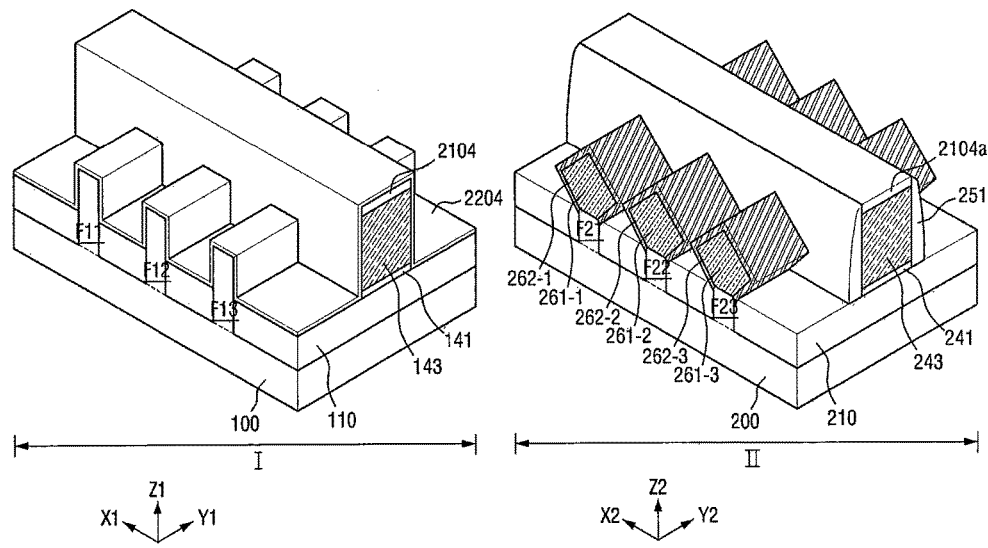

Referring to FIG. 31, a plurality of second elevated sources/drains 261-1, 261-2 and 261-3 are formed on the second fins F21, F22 and F23 (i.e., in the recesses 299-1, 299-2 and 299-3) in the second region II. The second elevated sources/drains 261-1, 261-2 and 261-3 may be formed by an epitaxial growth process.

Subsequently, a plurality of second metal alloy layers 262-1, 262-2 and 262-3 are formed on the upper surfaces and the sidewalls of the second elevated sources/drains 261-1, 261-2 and 261-3. Specifically, after a metal layer is formed on the second elevated sources/drains 261-1, 261-2 and 261-3 by, for example, a plating method, the second metal alloy layers 262-1, 262-2 and 262-3 are formed by heat treatment, and an unreacted metal layer is removed to expose the second metal alloy layers 262-1, 262-2 and 262-3.

Figure 32:
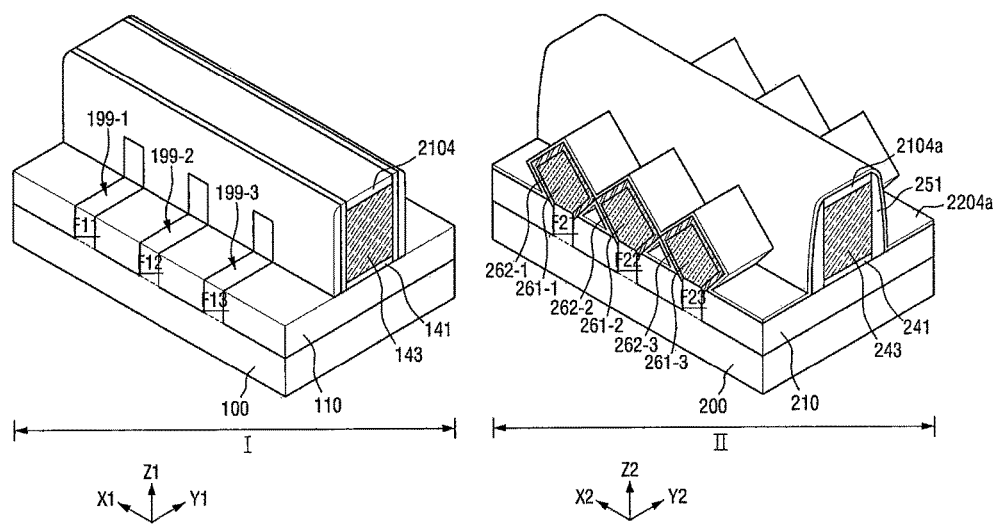

Referring to FIG. 32, a mask film 2204a is formed to cover the second region II, and in the first region I, the first spacer 151 and the second spacer 152 are formed on the sidewall of the first dummy gate electrode 143. Specifically, as described above, the mask film 2204 is present in the first region I. In this case, a second insulating film (not shown) is formed on the first region I and the second region II, and the mask film 2204 and the second insulating film formed in the first region I are etched back without etching the second insulating film formed in the second region II. Thus, the first spacer 151 and the second spacer 152 may be formed in the first region I, and the mask film 2204a may be formed in the second region II. In this case, the first spacer 151 and the second spacer 152 may be formed on the sidewall of the first dummy gate electrode 143 and may leave the upper surface of the mask pattern 2104 exposed.

Subsequently, a plurality of recesses 199-1, 199-2 and 199-3 are formed by removing a portion of the first fins F11, F12 and F13 that are exposed on both sides of the first dummy gate electrode 143.

Figure 33:
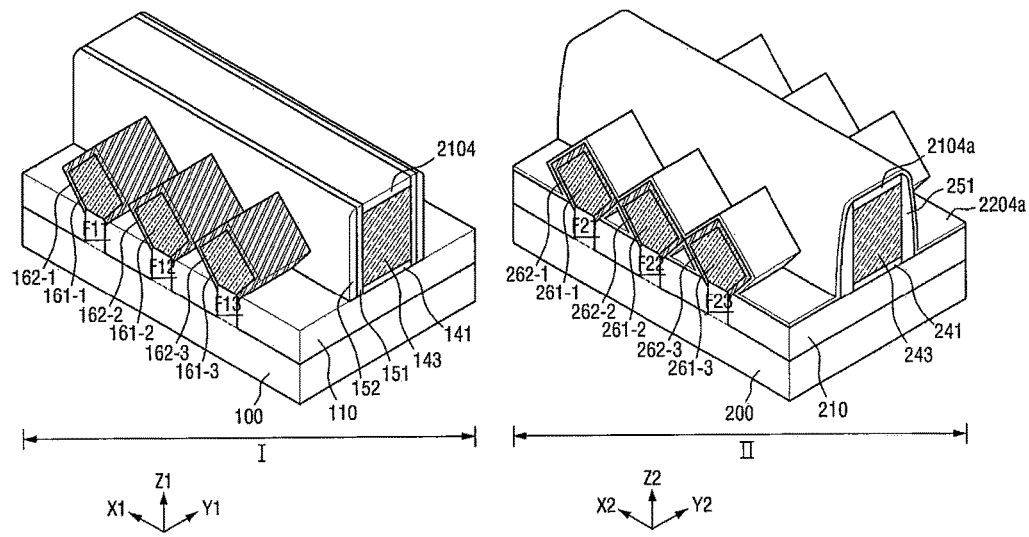

Referring to FIG. 33, a plurality of first elevated sources/drains 161-1, 161-2 and 161-3 are formed on the first fins F11, F12 and F13 (i.e., in the recesses 199-1, 199-2 and 199-3) in the first region I. The first elevated sources/drains 161-1, 161-2 and 161-3 may be formed by an epitaxial growth process.

Subsequently, a plurality of first metal alloy layers 162-1, 162-2 and 162-3 are formed on the upper surfaces and the sidewalls of the first elevated sources/drains 161-1, 161-2 and 161-3. Specifically, after a metal layer is formed on the first elevated sources/drains 161-1, 161-2 and 161-3 by, for example, a plating method, the first metal alloy layers 162-1, 162-2 and 162-3 are formed by heat treatment, and an unreacted metal layer is removed. In this case, the metal layer may be formed by a CVD method instead of the plating method.

Figure 34:
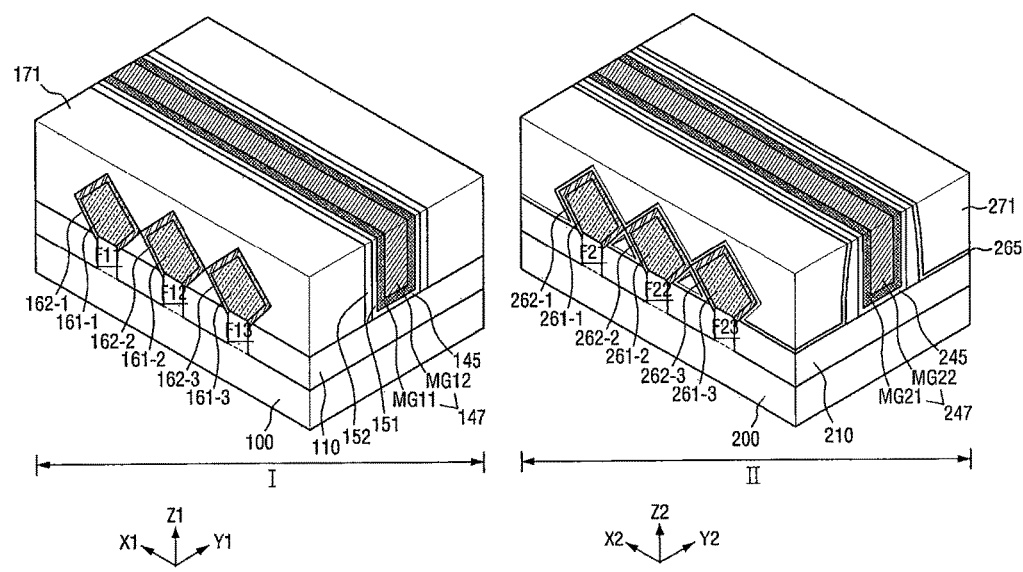

Referring to FIG. 34, the first interlayer insulating film 171 is formed in the first region I, and the third interlayer insulating film 271 is formed in the second region II. Each of the first interlayer insulating film 171 and the third interlayer insulating film 271 may be, e.g., at least one of an oxide film, a nitride film, and an oxynitride film.

Subsequently, the first interlayer insulating film 171 and the third interlayer insulating film 271 are planarized until the upper surfaces of the first dummy gate electrode 143 and the second dummy gate electrode 243 are exposed. As a result of the planarization process, a portion of the mask film 2204a located above the second dummy gate electrode 243 is removed, thereby completing the sidewall insulating film 265.

Subsequently, the first dummy gate insulating film 141, the first dummy gate electrode 143, the second dummy gate insulating film 241 and the second dummy gate electrode 243 are removed. Accordingly, first and second trenches are formed to expose the element isolation film 110.

Subsequently, the first gate insulating film 145 and the first gate electrode 147 are formed in the first trench, and a second gate insulating film 245 and the second gate electrode 247 are formed in the second trench. The first gate electrode 147 may include metal layers MG11 and MG12, and the second gate electrode 247 may include metal layers MG21 and MG22. In this case, the metal layer MG11 which adjusts a work function of the n-type fin type transistor may be different from the metal layer MG12 which adjusts a work function of the p-type fin type transistor.

Figure 35:
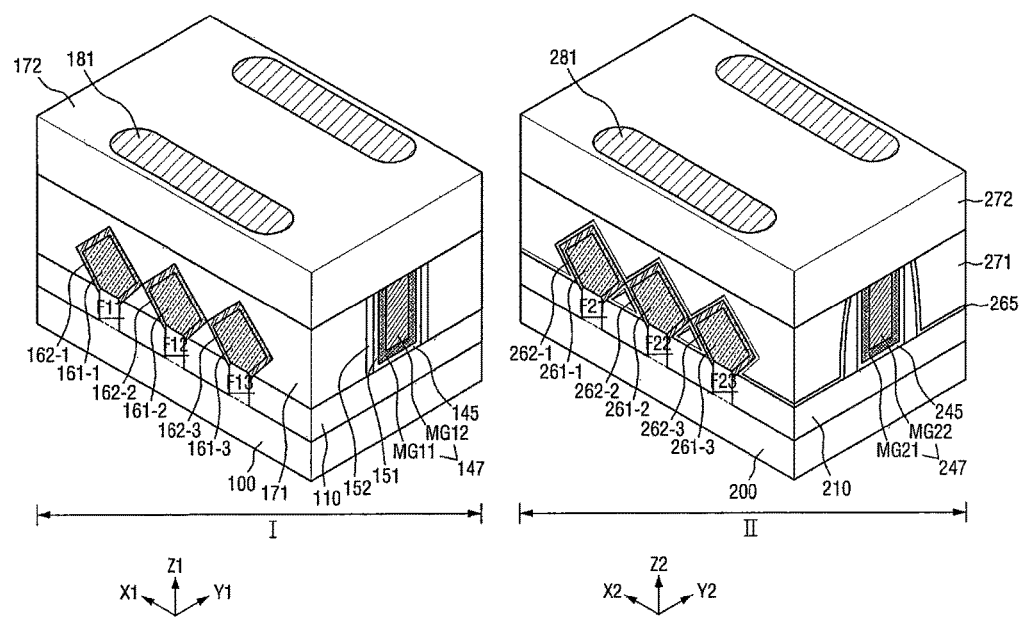

Referring to FIG. 35, the second interlayer insulating film 172 and the fourth interlayer insulating film 272 are formed on a resultant structure of FIG. 34. Each of the second interlayer insulating film 172 and the fourth interlayer insulating film 272 may be, e.g., at least one of an oxide film, a nitride film, and an oxynitride film.

Subsequently, a first contact hole 181a is formed to pass through the first interlayer insulating film 171 and the second interlayer insulating film 172 to expose a portion (i.e., upper surface) of the first metal alloy layer 162. A second contact hole 281a is formed to pass through the third interlayer insulating film 271 and the fourth interlayer insulating film 272 to expose a portion (i.e., upper surface) of the second metal alloy layer 262.

Subsequently, first and second contacts 181 and 182 are formed to fill up the respective first and second contact holes 181a and 281a.

Next, an example of an electronic system that uses the semiconductor device described with reference to FIGS. 1 to 16 will be described.

Figure 36:
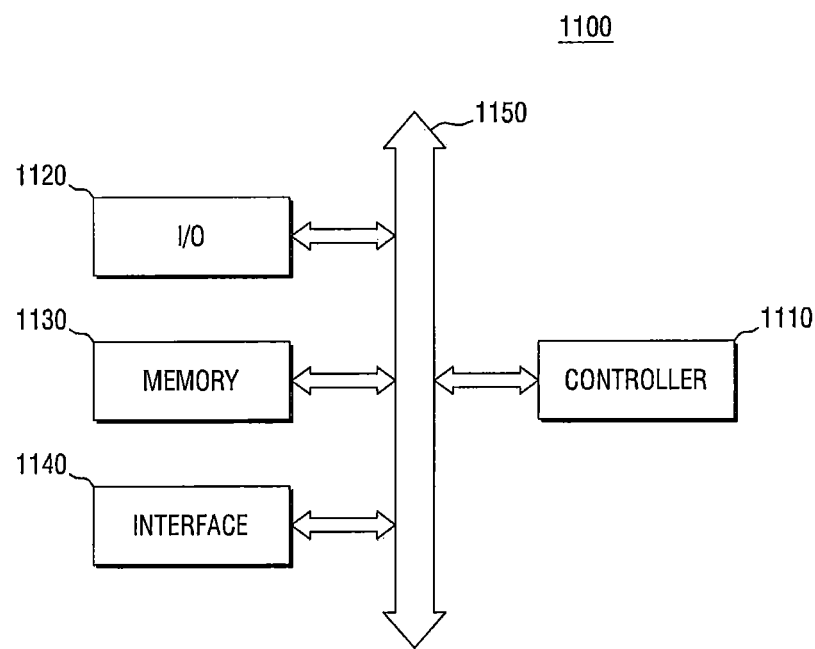
FIG. 36 is a block diagram of an electronic system including a semiconductor device in accordance with some embodiments of the present inventive concept.

FIG. 36 is a block diagram of an electronic system including a semiconductor device in accordance with some embodiments of the present inventive concept.

Referring to FIG. 36, an electronic system 1100 in accordance with the embodiment of the present inventive concept may include a controller 1110, an input/output (I/O) device 1120, a memory device 1130, an interface 1140 and a bus 1150. The controller 1110, the I/O device 1120, the memory device 1130 and/or the interface 1140 may be coupled to each other via the bus 1150. The bus 1150 corresponds to a data transmission path.

The controller 1110 may include at least one of a microprocessor, a digital signal processor, a microcontroller, and logic devices capable of performing functions similar to those thereof. The input/output device 1120 may include a keypad, a keyboard, a display device and the like. The memory device 1130 may store data and/or commands and the like. The interface 1140 may function to transmit/receive data to/from a communication network. The interface 1140 may be a wired or wireless interface. For example, the interface 1140 may include an antenna or a wired/wireless transceiver or the like. Although not shown, the electronic system 1100 may further include a high-speed DRAM and/or SRAM or the like as an operating memory for improving an operation of the controller 1110. The semiconductor device in accordance with some embodiments of the present inventive concept may be provided in the memory device 1130, or may be provided as a part of the controller 1110, the I/O device 1120 or the like.

The electronic system 1100 may be applied to a personal digital assistant (PDA), portable computer, web tablet, wireless phone, mobile phone, digital music player, memory card, or all electronic products capable of transmitting and/or receiving information in a wireless environment.

Figure 37:
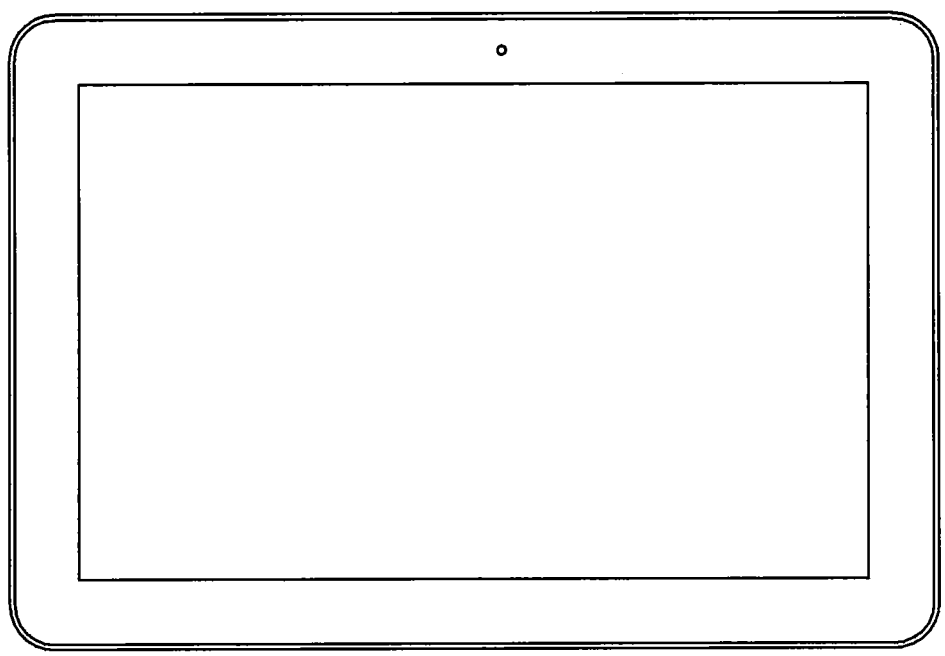
FIGS. 37 and 38 show exemplary semiconductor systems in which a semiconductor device in accordance with some embodiments of the present inventive concept may be used.
Figure 38:
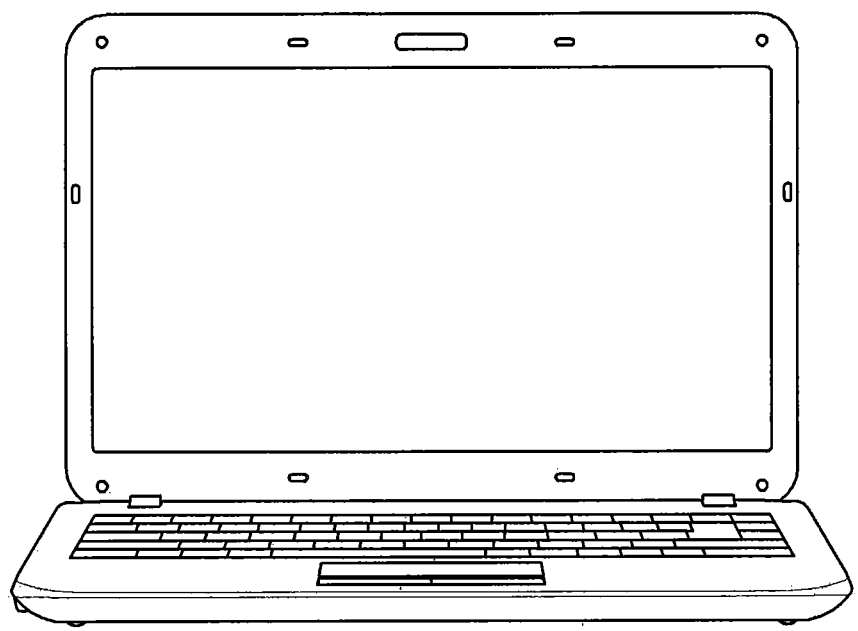

FIGS. 37 and 38 show an exemplary semiconductor system to which a semiconductor device in accordance with some embodiments of the present inventive concept can be applied. FIG. 37 shows a tablet PC, and FIG. 38 shows a laptop computer. At least one of the semiconductor devices in accordance with some embodiments of the present inventive concept may be used in a tablet PC, a laptop computer or the like. It will be apparent to those skilled in the art that the semiconductor device in accordance with some embodiments of the present inventive concept may be applied to other integrated circuit devices (not shown).

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A method for fabricating a semiconductor device, the method comprising:
    forming a first fin, a second fin and a third fin on a substrate;
    forming a first gate electrode on the substrate that intersects the first fin, the second fin and the third fin;
    forming a first elevated source/drain on the first fin on both sides of the first gate electrode, forming a second elevated source/drain on the second fin on both sides of the first gate electrode and forming a third elevated source/drain on the third fin on both sides of the first gate electrode;
    forming a first metal alloy layer on upper surfaces and sidewalls of the first elevated source/drain, forming a second metal alloy layer on upper surfaces and sidewalls of the second elevated source/drain and forming a third metal alloy layer on upper surfaces and sidewalls of the third elevated source/drain, the first, second and third metal alloy layers each having first and second lower sidewalls, wherein the first metal alloy layer directly contacts the second metal alloy layer and the second metal alloy layer directly contacts the third metal alloy layer;
    forming an insulating film on the first, second and third elevated source/drains and on the first, second and third metal alloy layers; and
    forming a contact that penetrates the insulating film so that the contact directly contacts upper surfaces of at least one of the first metal alloy layer, the second metal alloy layer and the third metal alloy layer,
    wherein a first air gap is provided between the second lower sidewall of the first metal alloy layer and the first lower sidewall of the second metal alloy layer, and a second air gap is provided between the second lower sidewall of the second metal alloy layer and the first lower sidewall of the third metal alloy layer.

2. The method of claim 1, wherein the contact does not directly contact the first or second lower sidewalls of any of the first, second or third metal alloy layers.

3. The method of claim 1, wherein forming the first, second and third metal alloy layers comprises:
    forming first, second and third metal layers on the respective first, second and third elevated source/drains; and
    performing heat treatment to react the first, second and third elevated source/drains with the respective first, second and third metal layers.

4. The method of claim 3, wherein forming the first, second and third metal layers comprises forming the first, second and third metal layers by electroless plating.

5. The method of claim 3, wherein forming the first, second and third metal layers comprises forming the first, second and third metal layers by electro-plating.

6. The method of claim 1, further comprising forming an isolation layer on side surfaces of the first, second and third fins.

7. The method of claim 6, wherein the lower sidewalls of the first metal alloy layer meet an upper surface of the isolation layer at respective acute angles.

* * * * *